(12) United States Patent
Costa

(10) Patent No.: US 10,049,758 B2
(45) Date of Patent: Aug. 14, 2018

(54) WORD LINE DEPENDENT PASS VOLTAGES IN NON-VOLATILE MEMORY

(71) Applicant: SanDisk Technologies LLC, Plano, TX (US)

(72) Inventor: Xiying Costa, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/204,257

(22) Filed: Jul. 7, 2016

(65) Prior Publication Data

US 2018/0012667 A1   Jan. 11, 2018

(51) Int. Cl.
| | |
|---|---|
| *G11C 16/34* | (2006.01) |
| *G11C 16/04* | (2006.01) |
| *G11C 16/28* | (2006.01) |
| *G11C 16/10* | (2006.01) |
| *G06F 11/10* | (2006.01) |

(52) U.S. Cl.
CPC ...... *G11C 16/3445* (2013.01); *G11C 16/0483* (2013.01); *G11C 16/10* (2013.01); *G11C 16/28* (2013.01); *G06F 11/1076* (2013.01)

(58) Field of Classification Search
CPC .. G11C 16/04; G11C 16/3445; G11C 16/0483
USPC ........................ 365/185.01–185.33
See application file for complete search history.

(56) References Cited

U.S. PATENT DOCUMENTS

| | | | |
|---|---|---|---|
| 6,907,497 B2 * | 6/2005 | Hosono | ............. G11C 16/3454 365/185.22 |
| 7,436,709 B2 | 10/2008 | Higashitani | |
| 7,983,084 B2 | 7/2011 | Tokiwa et al. | |
| 8,014,205 B2 | 9/2011 | Hemink | |
| 8,120,959 B2 * | 2/2012 | Lee | ........................ G11C 8/12 365/185.13 |
| 8,228,733 B2 | 7/2012 | Tokiwa et al. | |

(Continued)

OTHER PUBLICATIONS

Chen, Wei-Chen et al., "Study of the Programming Sequence Induced Back-Pattern Effect in Split-Page 3D Vertical-Gate (VG) NAND Flash," Proceedings of Technical Program—2014 International Symposium on VLSI Technology, Systems and Application (VLSI-TSA), Apr. 2014, 2 pages.

(Continued)

*Primary Examiner* — Harry W Byrne
(74) *Attorney, Agent, or Firm* — Vierra Magen Marcus LLP

(57) ABSTRACT

Sensing in non-volatile memory is performed using bias conditions that are dependent on the position of a selected memory cell within a group of non-volatile memory cells. During sensing, a selected memory cell receives a reference voltage while the remaining memory cells receive a read or verify pass voltage. For at least a subset of the unselected memory cells, the pass voltage that is applied is dependent upon the position of the selected memory cell in the group. As programming progresses from a memory cell at a first end of a NAND string toward a memory cell at a second end of the NAND string, for example, the pass voltage for at least a subset of the unselected memory cells that have already been subjected to programming may be increased. This technique may reduce the effects of an increased channel resistance that occurs as more memory cells are programmed.

10 Claims, 18 Drawing Sheets

(56) References Cited

U.S. PATENT DOCUMENTS

| | | | |
|---|---|---|---|
| 8,982,637 B1 | 3/2015 | Dong et al. | |
| 9,330,770 B2 | 5/2016 | Shim et al. | |
| 2003/0214853 A1* | 11/2003 | Hosono | G11C 16/3454 |
| | | | 365/200 |
| 2013/0182509 A1* | 7/2013 | Lee | G11C 16/3459 |
| | | | 365/185.22 |
| 2014/0347928 A1* | 11/2014 | Lee | G11C 16/0483 |
| | | | 365/185.11 |
| 2015/0003151 A1* | 1/2015 | Lee | G11C 16/10 |
| | | | 365/185.02 |
| 2015/0003162 A1 | 1/2015 | Mui et al. | |
| 2015/0070986 A1 | 3/2015 | Hirai et al. | |
| 2015/0109862 A1 | 4/2015 | Shibata et al. | |

OTHER PUBLICATIONS

International Search Report & the Written Opinion of the International Searching Authority dated Aug. 25, 2017, International Application No. PCT/US2017/034886 filed May 28, 2017.

* cited by examiner

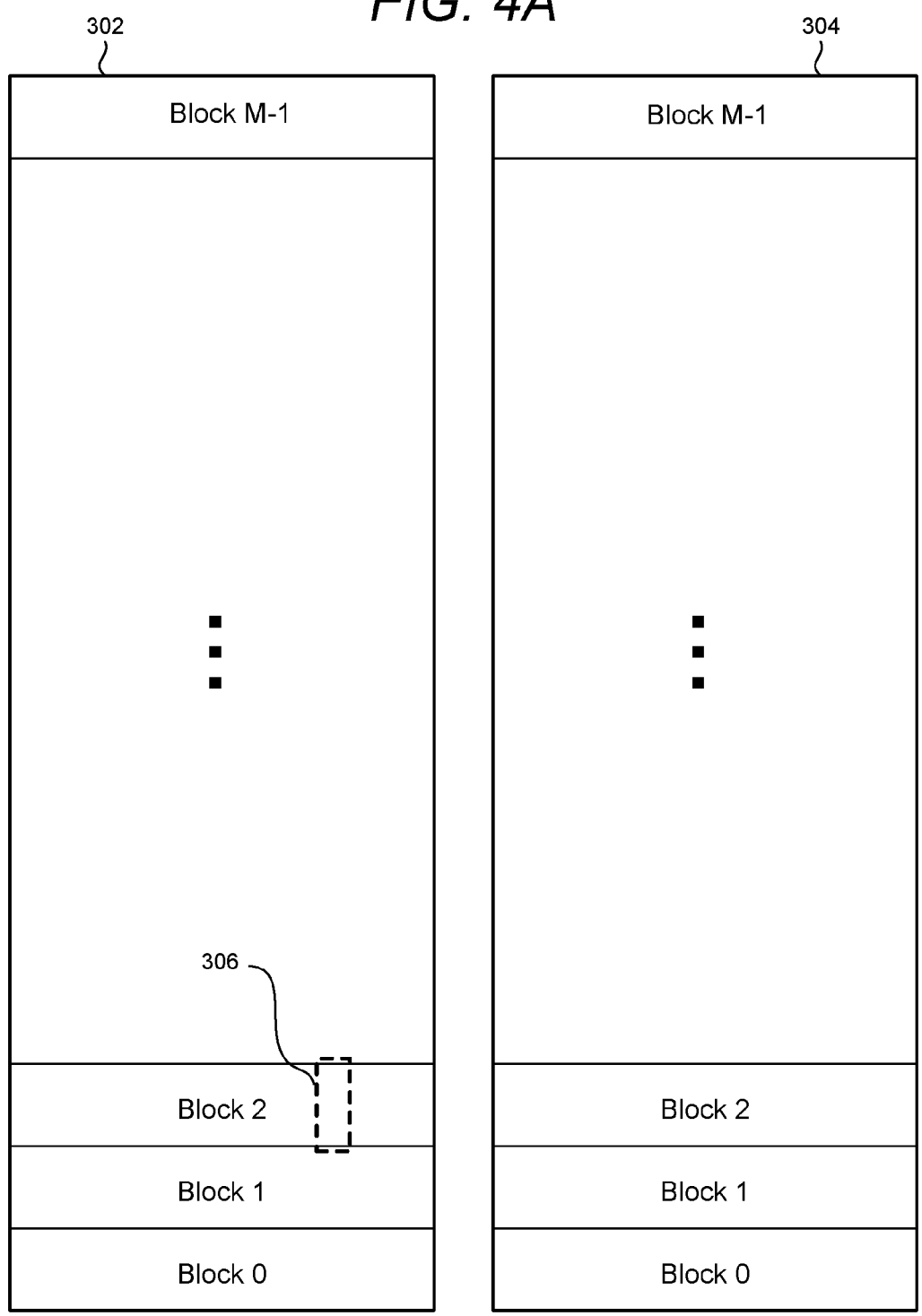

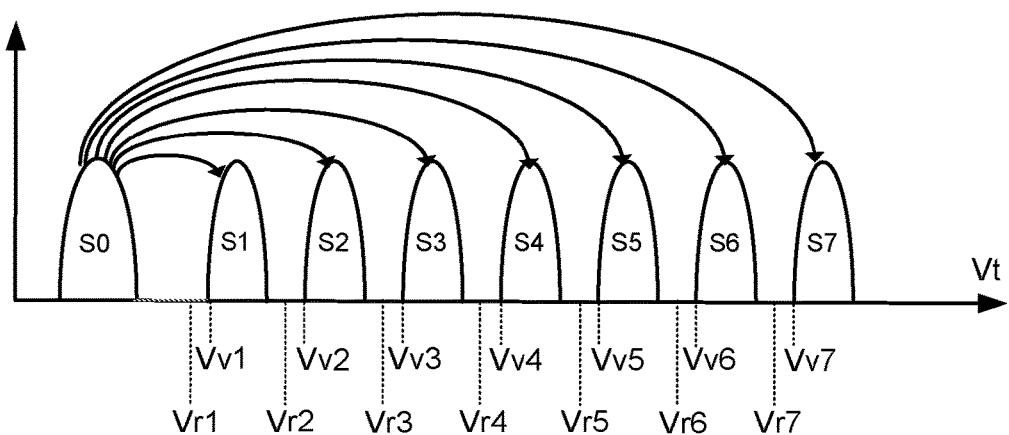
FIG. 5
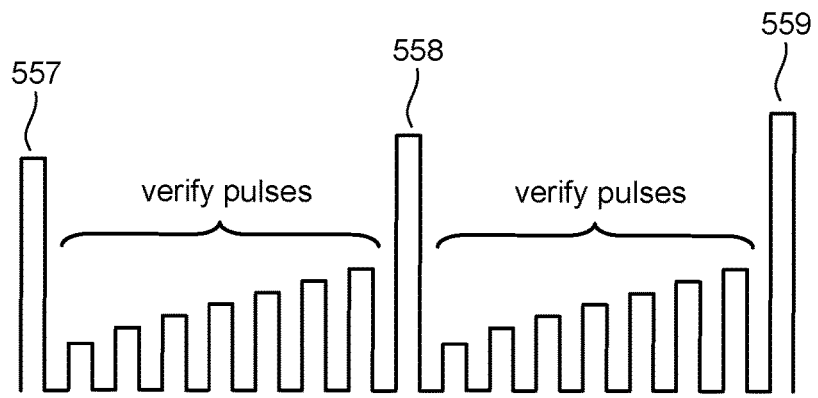
FIG. 6
FIG. 7F
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

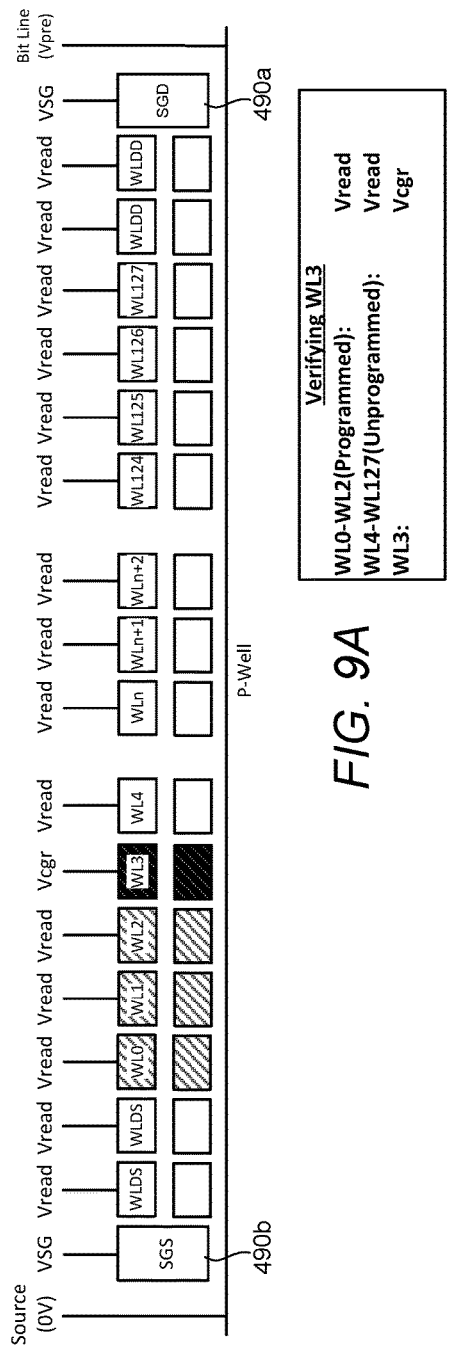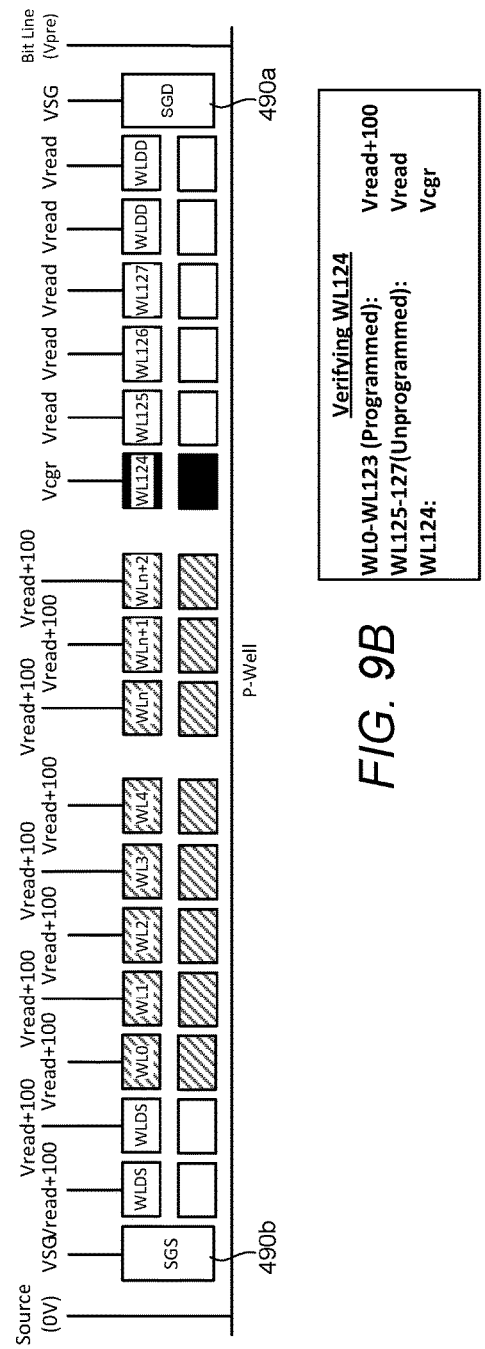

Program Verification Bias By Selected WL Zone

|  | Zone 0 | Zone 1 | Zone 2 | Zone 3 | Zone 4 | Zone 5 | Zone 6 | Zone 7 |
|---|---|---|---|---|---|---|---|---|
| BL | Vpre | Vpre | Vpre | Vpre | Vpre | Vpre | Vpre | Vpre |
| SGD | VSG | VSG | VSG | VSG | VSG | VSG | VSG | VSG |
| WL(Drain) | VreadL | VreadL | VreadL | VreadL | VreadL | VreadL | VreadL | VreadL |
| WL(n+1) | VreadK | VreadK | VreadK | VreadK | VreadK | VreadK | VreadK | VreadK |
| WLn | Vcgr | Vcgr | Vcgr | Vcgr | Vcgr | Vcgr | Vcgr | Vcgr |
| WL(n-1) | VreadK | VreadK | VreadK | VreadK | VreadK | VreadK | VreadK | VreadK |
| WL(source) | Vread-700 | Vread-600 | Vread-500 | Vread-400 | Vread-300 | Vread-200 | Vread-100 | Vread |
| SGS | VSG | VSG | VSG | VSG | VSG | VSG | VSG | VSG |
| SL | 0V | 0V | 0V | 0V | 0V | 0V | 0V | 0V |

FIG. 10

Program Verification Bias By Selected WL Zone

|  | Zone 0 | Zone 1 | Zone 2 | Zone 3 | Zone 4 | Zone 5 | Zone 6 | Zone 7 |
|---|---|---|---|---|---|---|---|---|
| BL | Vpre | Vpre | Vpre | Vpre | Vpre | Vpre | Vpre | Vpre |
| SGD | VSG | VSG | VSG | VSG | VSG | VSG | VSG | VSG |
| WL(Drain) | Vreadl-700 | Vreadl-600 | Vreadl-500 | Vreadl-400 | Vreadl-300 | Vreadl-200 | Vreadl-100 | Vreadl |
| WL(n+1) | VreadK | VreadK | VreadK | VreadK | VreadK | VreadK | VreadK | VreadK |
| WLn | Vcgr | Vcgr | Vcgr | Vcgr | Vcgr | Vcgr | Vcgr | Vcgr |
| WL(n-1) | VreadK | VreadK | VreadK | VreadK | VreadK | VreadK | VreadK | VreadK |
| WL(source) | Vread-700 | Vread-600 | Vread-500 | Vread-400 | Vread-300 | Vread-200 | Vread-100 | Vread |
| SGS | VSG | VSG | VSG | VSG | VSG | VSG | VSG | VSG |
| SL | 0V | 0V | 0V | 0V | 0V | 0V | 0V | 0V |

FIG. 11

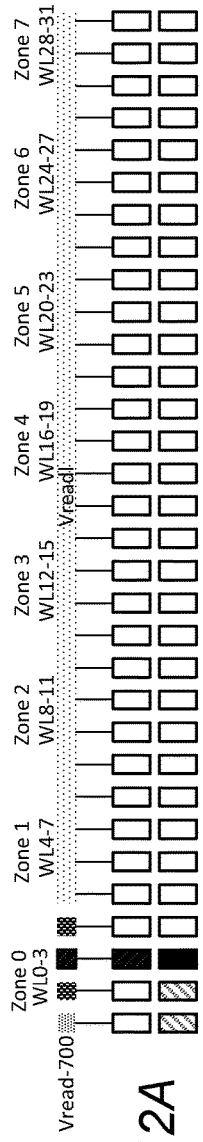
FIG. 12A
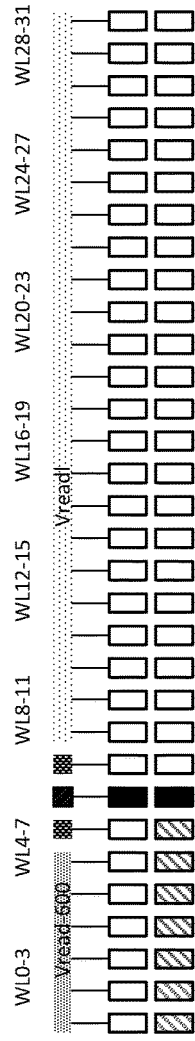
FIG. 12B
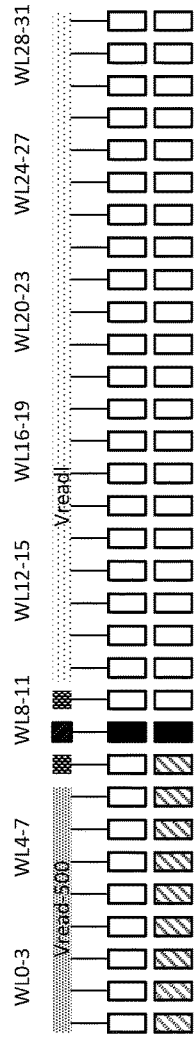
FIG. 12C
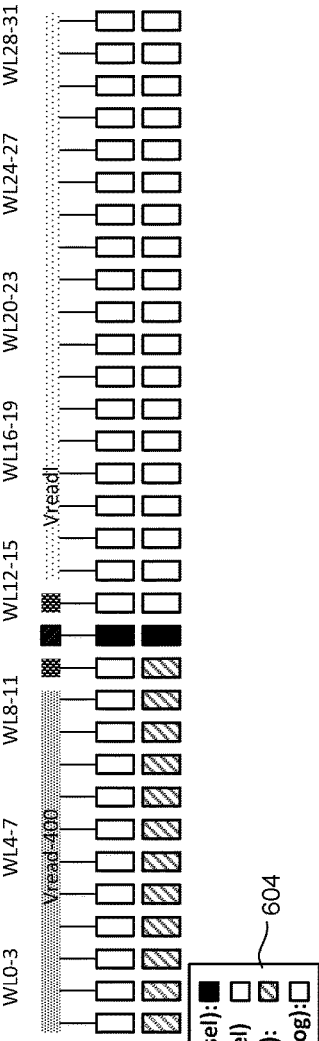
FIG. 12D
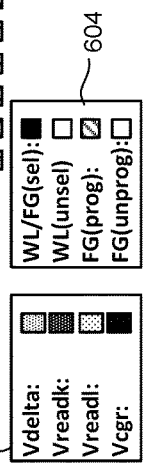

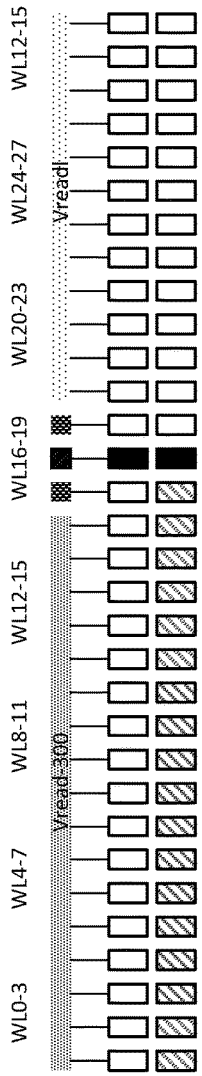
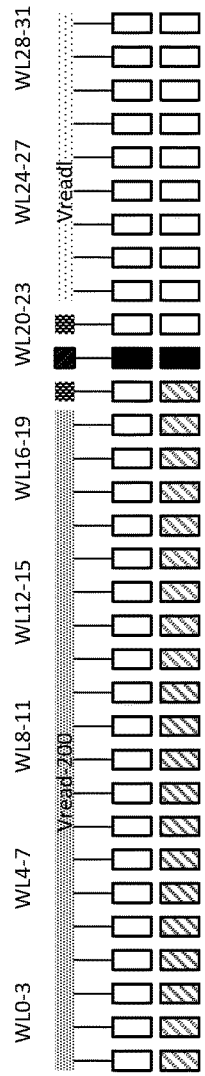
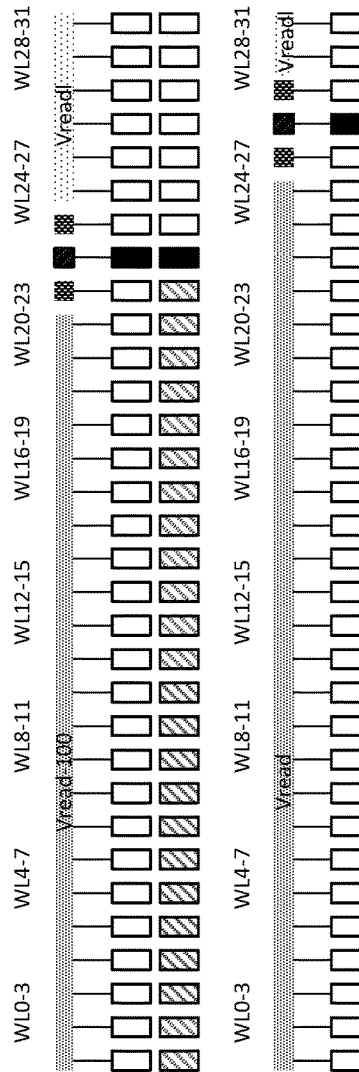
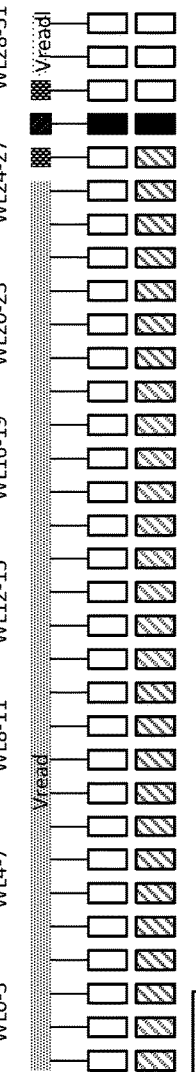
FIG. 12E
FIG. 12F
FIG. 12G
FIG. 12H
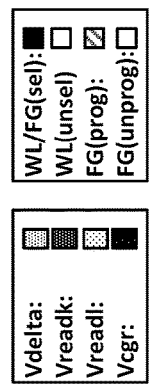

Read Bias By Selected WL Zone

| | Zone 0 | Zone 1 | Zone 2 | Zone 3 | Zone 4 | Zone 5 | Zone 6 | Zone 7 |
|---|---|---|---|---|---|---|---|---|
| BL | Vpre | Vpre | Vpre | Vpre | Vpre | Vpre | Vpre | Vpre |
| SGD | VSG | VSG | VSG | VSG | VSG | VSG | VSG | VSG |
| WL(Drain) | VreadL | VreadL | VreadL | VreadL | VreadL | VreadL | VreadL | VreadL |
| WL(n+1) | VreadK | VreadK | VreadK | VreadK | VreadK | VreadK | VreadK | VreadK |
| WLn | Vcgr | Vcgr | Vcgr | Vcgr | Vcgr | Vcgr | Vcgr | Vcgr |
| WL(n-1) | VreadK | VreadK | VreadK | VreadK | VreadK | VreadK | VreadK | VreadK |
| WL(source) | Vread | Vread-100 | Vread-200 | Vread-300 | Vread-400 | Vread-500 | Vread-600 | Vread-700 |
| SGS | VSG | VSG | VSG | VSG | VSG | VSG | VSG | VSG |
| SL | 0V | 0V | 0V | 0V | 0V | 0V | 0V | 0V |

*FIG. 13*

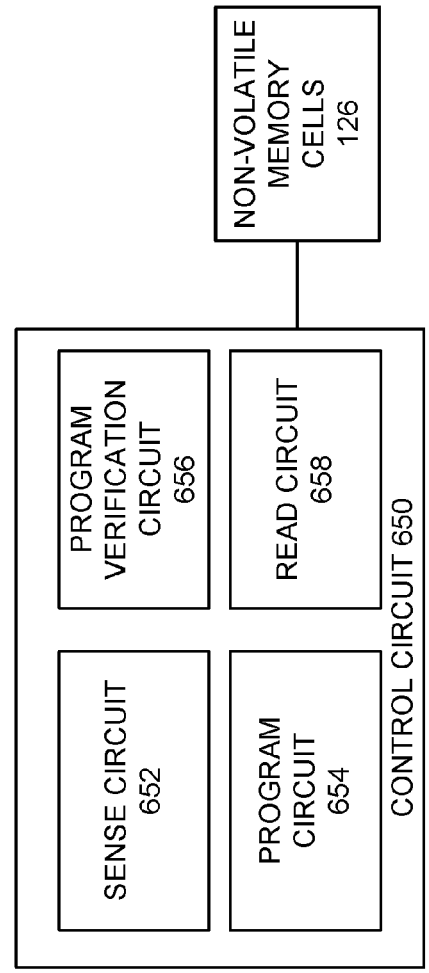

*FIG. 15*

State Dependent Program Verification Bias By Selected WL Zone

| States S0, S1, S2, S3, S4, S5, S6 | Zone 0 WL0-7 | Zone 1 WL8-15 | Zone 2 WL16-23 | Zone 3 WL24-31 | Zone 4 WL32-39 | Zone 5 WL40-47 |
|---|---|---|---|---|---|---|
| WL(Drain) | VreadL | VreadL | VreadL | VreadL | VreadL | VreadL |
| WL(n+1) | VreadK | VreadK | VreadK | VreadK | VreadK | VreadK |
| WL(n-1) | VreadK | VreadK | VreadK | VreadK | VreadK | VreadK |
| WL(source) | Vread-62.5 | Vread-50 | Vread-37.5 | Vread-25 | Vread-12.5 | Vread |

FIG. 16A

State Dependent Program Verification Bias By Selected WL Zone

| State S7 | Zone 0 WL0-3 | Zone 1 WL4-7 | Zone 2 WL8-11 | Zone 3 WL12-15 | Zone 4 WL16-19 | Zone 5 WL20-23 | Zone 6 WL24-27 | Zone 7 WL28-31 | Zone 8 WL32-35 | Zone 9 WL36-39 | Zone 10 WL40-43 | Zone 11 WL40-47 |
|---|---|---|---|---|---|---|---|---|---|---|---|---|
| WL(Drain) | VreadL | VreadL | VreadL | VreadL | VreadL | VreadL | VreadL | VreadL | VreadL | VreadL | VreadL | VreadL |
| WL(n+1) | VreadK | VreadK | VreadK | VreadK | VreadK | VreadK | VreadK | VreadK | VreadK | VreadK | VreadK | VreadK |
| WL(n-1) | VreadK | VreadK | VreadK | VreadK | VreadK | VreadK | VreadK | VreadK | VreadK | VreadK | VreadK | VreadK |
| WL(source) | Vread-137.5 | Vread-125 | Vread-112.5 | Vread-100 | Vread-87.5 | Vread-75 | Vread-62.5 | Vread-50 | Vread-37.5 | Vread-25 | Vread-12.5 | Vread |

FIG. 16B

WORD LINE DEPENDENT PASS VOLTAGES
IN NON-VOLATILE MEMORY

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (i.e. data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Prior systems have sought to combat read and programming errors by providing various compensations or other techniques to improve data reliability. Nevertheless, errors associated with programming and reading continue to be seen.

BRIEF DESCRIPTION OF THE DRAWINGS

FIG. 4A is a block diagram of a memory structure having two planes.

FIG. 5 depicts threshold voltage distributions and a process for programming non-volatile memory.

FIG. 6 depicts a plurality of programming pulses and a plurality of verify pulses.

FIG. 7F is a table depicting an example data encoding.

FIGS. 9A-9B are cross-sectional views of an example of a NAND string depicting sensing with a read pass voltage that is dependent upon a selected word line position.

FIG. 10 is a table depicting bias conditions for verifying programming of a group of non-volatile memory cells in one embodiment.

FIG. 11 is a table depicting bias conditions for verifying non-volatile memory cells in one embodiment.

FIGS. 12A-12H are cross-sectional views of an example of a NAND string depicting bias conditions for verifying programming of a group of non-volatile memory cells using word line dependent bias conditions in one embodiment.

FIG. 13 is a table depicting bias conditions for reading a group of non-volatile memory cells in one embodiment.

FIG. 15 is a block diagram of a memory device in one embodiment.

FIGS. 16A-16B are tables depicting a process of sensing for a page of non-volatile memory cells in one embodiment.

DETAILED DESCRIPTION

Figure 1:
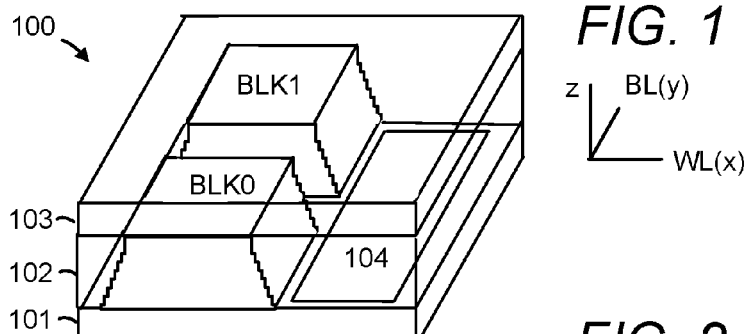
FIG. 1 is a perspective view of a 3D stacked non-volatile memory device.

The disclosed technology is directed to reducing errors when sensing in non-volatile memory. Read or verify operations are performed using bias conditions that are dependent on the position of a selected memory cell within a group of non-volatile memory cells. During sensing, the selected memory cell receives a read or verify voltage, referred to as a reference voltage, while the remaining memory cells receive a read or verify pass voltage. For at least a subset of the memory cells in the group, the pass voltage that is applied is dependent upon the position of the selected memory cell in the group.

Typically, individual groups of non-volatile memory cells, such as strings of memory cells arranged in series between a source line and a bit line, are programmed in a program order than begins at one end of the group and ends at the other end of the group. Programming the memory cells tends to raise the channel resistance of the group. The channel resistance increases as each memory cell is programmed, leading to the highest resistance and lowest channel conductance when programming the later programmed memory cells of the group. The increase in channel resistance after programming the earlier programmed memory cells of the group may cause the threshold voltage of those cells to appear to increase after programming. Additionally, the increased channel resistance when programming the later programmed memory cells may cause them to be programmed to higher levels than intended.

To compensate for the increase in channel resistance as programming progresses for groups of memory cells, the disclosed technology varies the pass voltage applied to at least a subset of the memory cells of the group during sensing based on the memory cell selected for programming. During program verification for example, the pass voltage applied to the subset of memory cells is increased as programming progresses from memory cells nearest a first select gate, such as a source select gate coupled to a source line, toward a second select gate, such as a drain select gate coupled to a bit line for the group. The increased pass voltage increases the channel conductance when programming later programmed memory cells. In this manner, the final distribution of threshold voltages for the group of memory cells may be more consistent and narrow. The increased pass voltage causes the channel to have a similar resistance when programming all of the memory cells of the group.

In one embodiment during reading, the pass voltage applied when reading the earlier programmed memory cells is higher relative to the pass voltage applied when reading the later programmed memory cells. The higher pass voltage can directly compensate for an apparent increase in threshold voltage due to the increased channel resistance from programming the later programmed memory cells.

In one embodiment, a group of memory cells, or group of word lines for a block of memory cells including the group, is partitioned into ranges or zones of one or more memory cells of the group. One or more control circuits apply bias conditions for sensing to the group that are based on the zone associated with the selected memory cell or word line. For example, the pass voltage applied to certain unselected memory cells of the group is varied based on the zone of the selected memory cell. Generally, a lower pass voltage is applied to these memory cells when the selected word line is in a lower zone corresponding to earlier programmed memory cells closer to a first select line. The pass voltage is increased for higher zones corresponding to later programmed memory cells closer to a second select line. In this manner, the pass voltage for the memory cells is higher when programming memory cells in higher zones after programming for lower zone memory cells completes. A higher pass voltage is used for the memory cells as more word lines of the group undergo programming.

In one embodiment, at least a subset of unselected memory cells that have already been subjected to programming receives the variable pass voltage. A programmed memory cell may refer to a memory cell or word line that has been subjected to programming since a last erase. When applying each programming pulse, the group typically includes a first set of memory cells that have undergone programming and a second set of memory cells that have not undergone programming. The first set may be positioned between a first select line and the selected word line and the second set may be positioned between a second select line and the selected word line In one embodiment, the system applies the variable pass voltage to at least a subset of the programmed memory cells positioned between a selected word line and the first select line. In another embodiment, the system applies the variable pass voltage to at least a subset of the unprogrammed memory cells positioned between a selected word line and the second select line.

In one embodiment, the system applies a pass voltage to the subset of memory cells that is dependent upon the reference voltage applied to the selected word line. The pass voltage may vary based on the reference voltage in addition to the position of the selected word line. For example, the system may use a lower pass voltage for the subset of memory cells when applying a higher read or verify reference voltage to a selected word line and a higher pass voltage when applying a lower read or verify reference voltage. The higher reference voltage applied to the selected word line may increase the channel conductance such that a lower pass voltage can be applied to the subset of memory cells while maintaining sufficient channel conductance for sensing.

FIG. 1 is a perspective view of an example of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
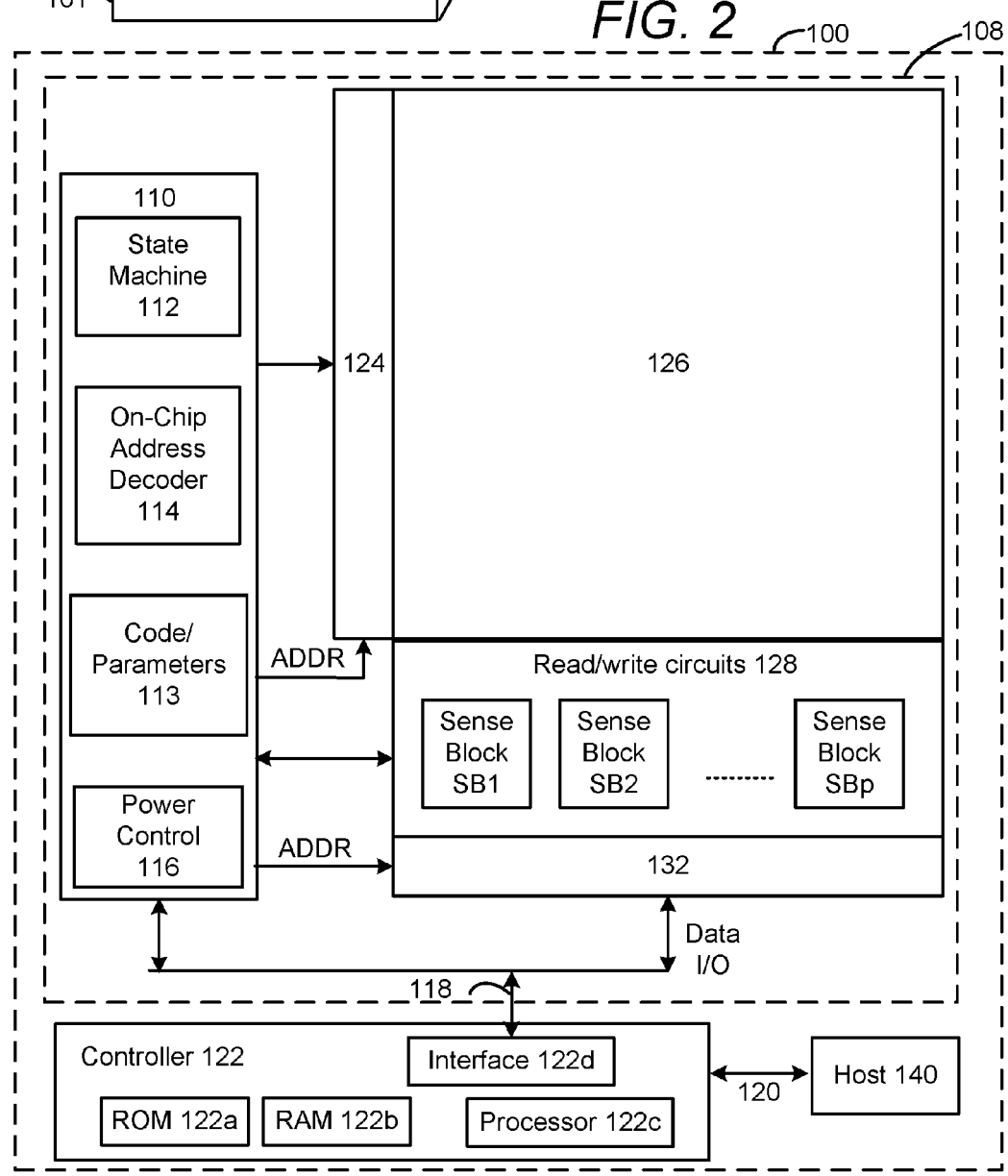
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c, ROM 122a, RAM 122b and a Memory Interface 122d. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between controller 122 and memory die 108. For example, memory interface 122d can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
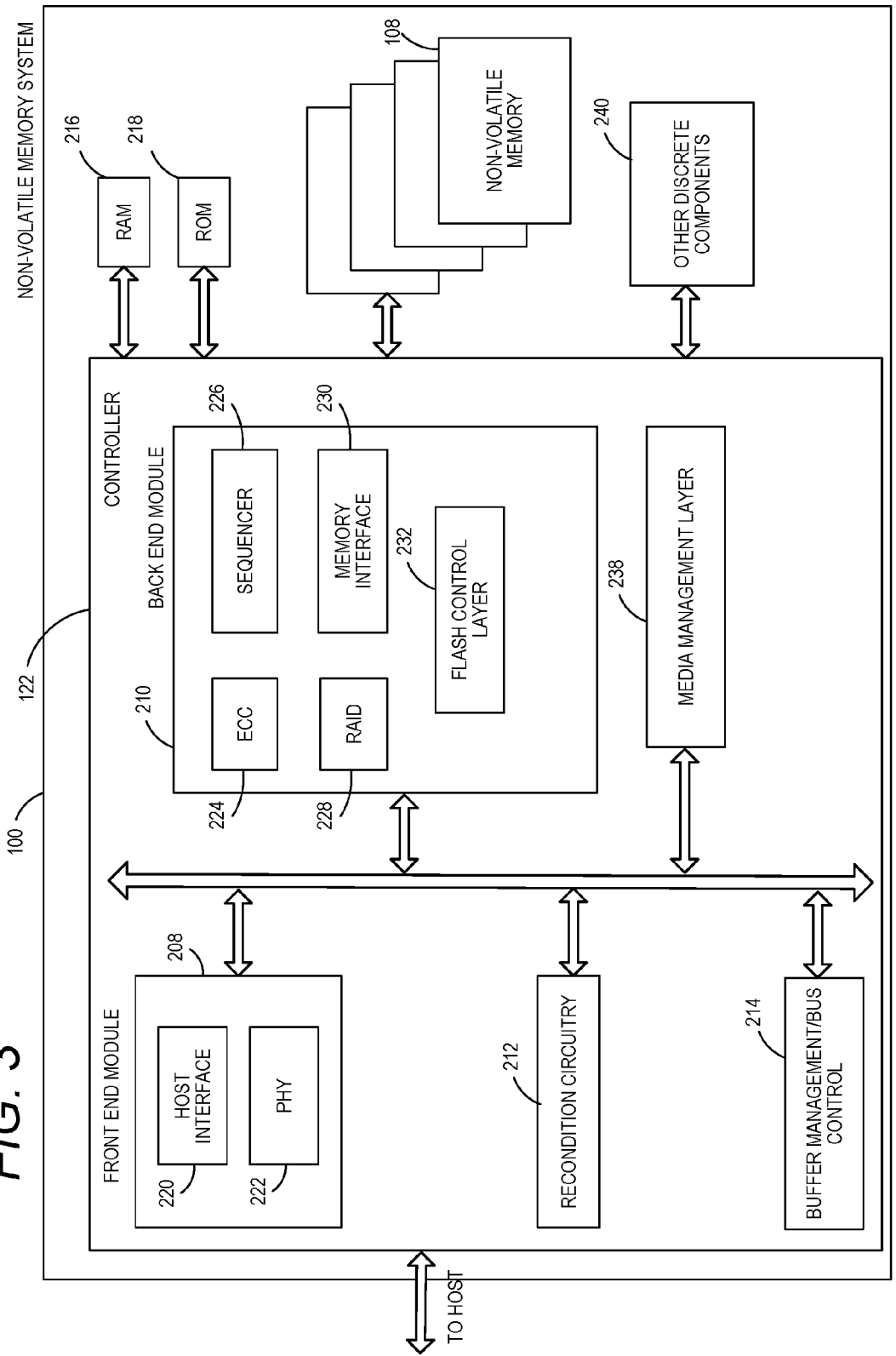
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e., RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing word line maintenance, as described herein.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Drives) module 228 manages generation of RAID parity and recovery of failed data. The RAID parity may be used as an additional level of integrity protection for the data being written into the non-volatile memory system 100. In some cases, the RAID module 228 may be a part of the ECC engine 224. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The FTL or MML 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. For example, some systems may have more than two planes. Other systems may only have one plane.

Figure 4B:
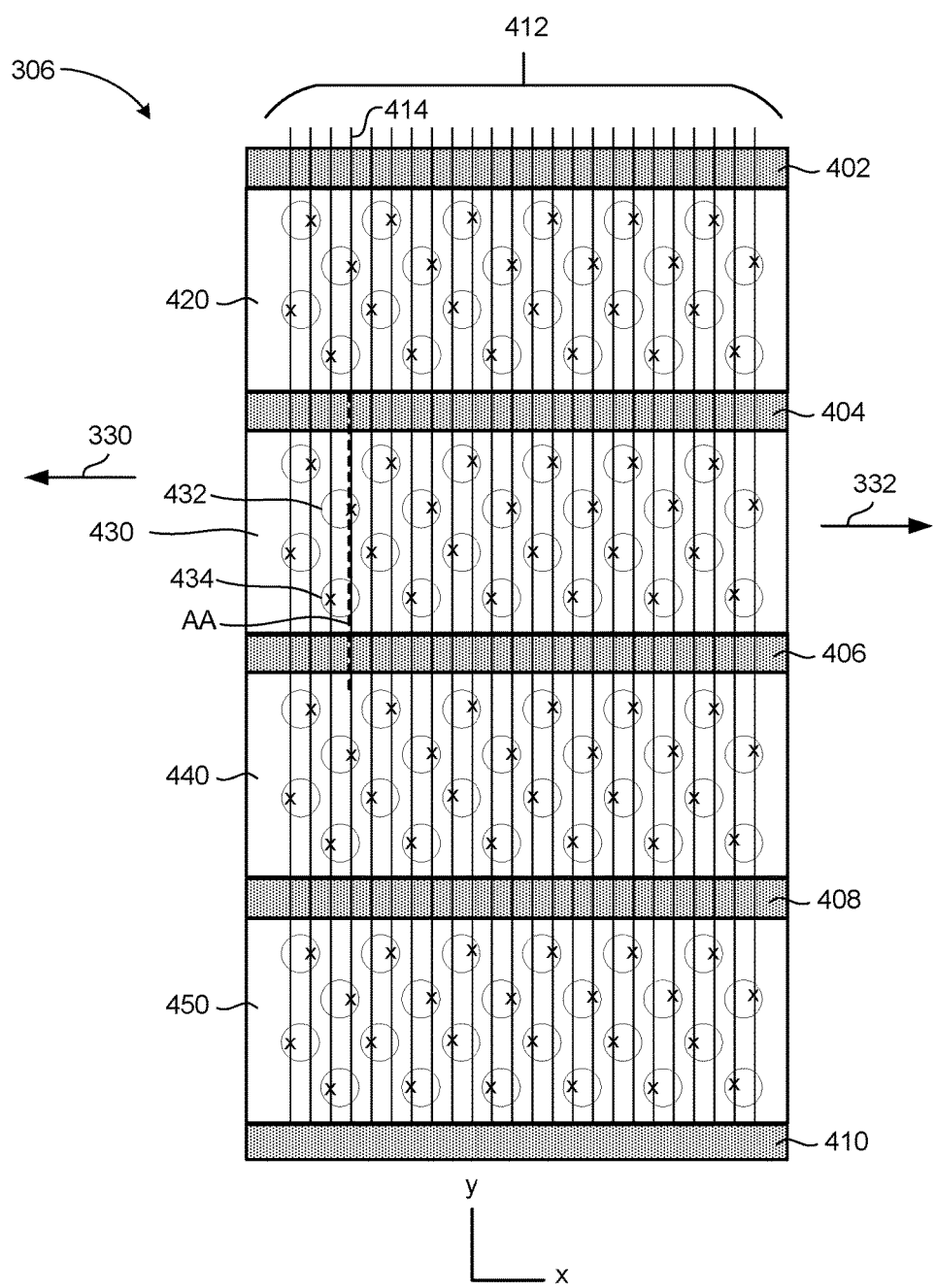
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
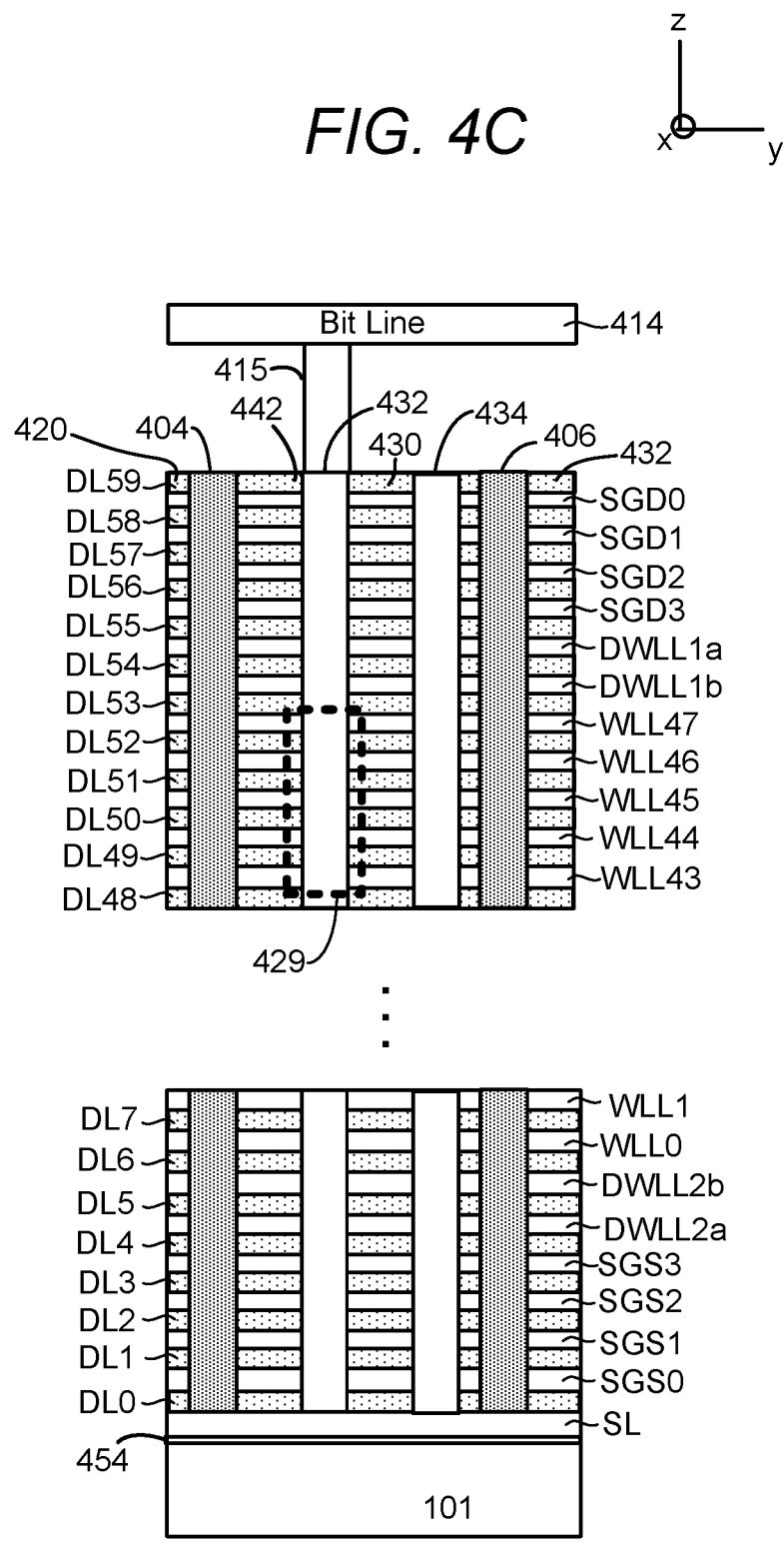
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
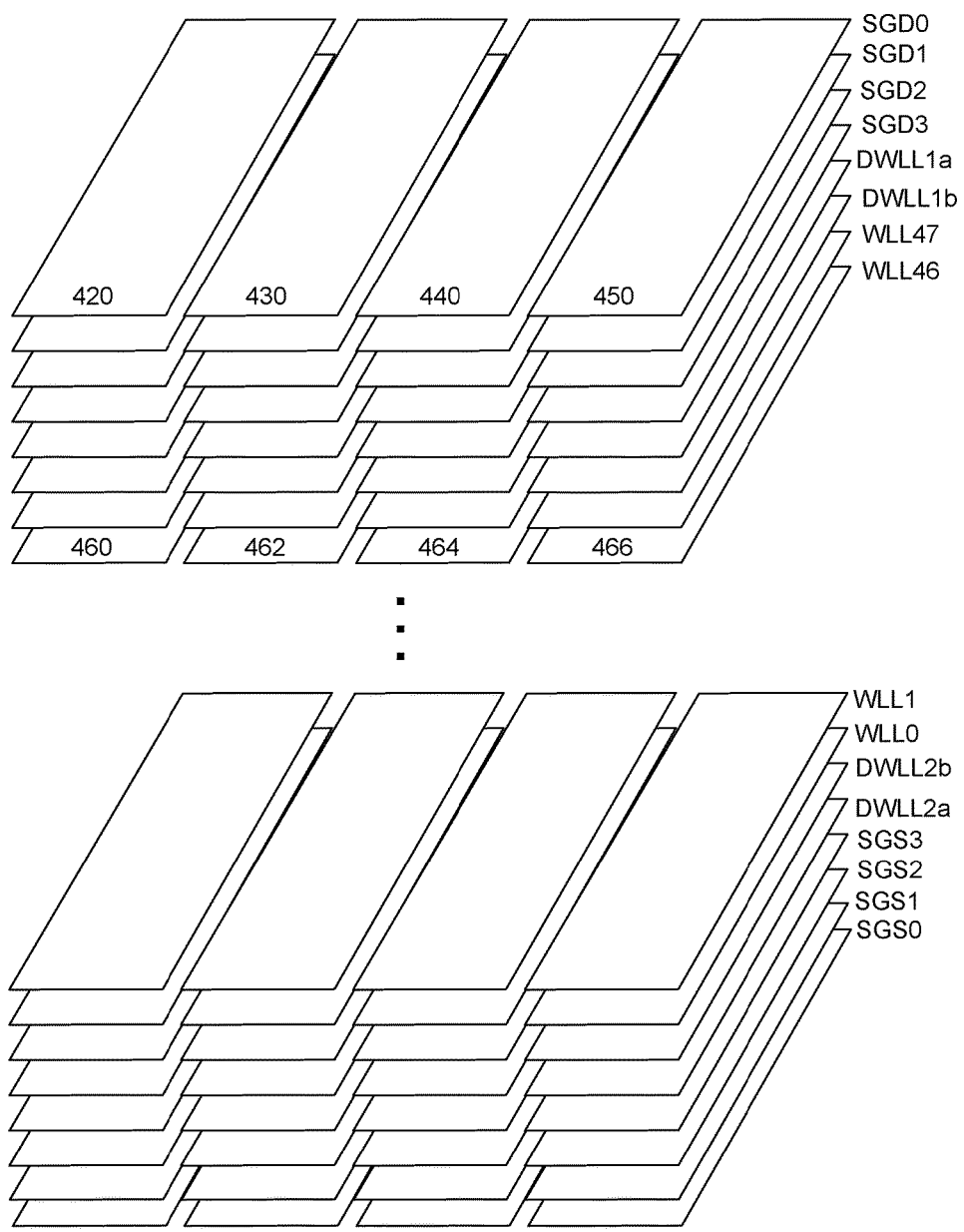
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
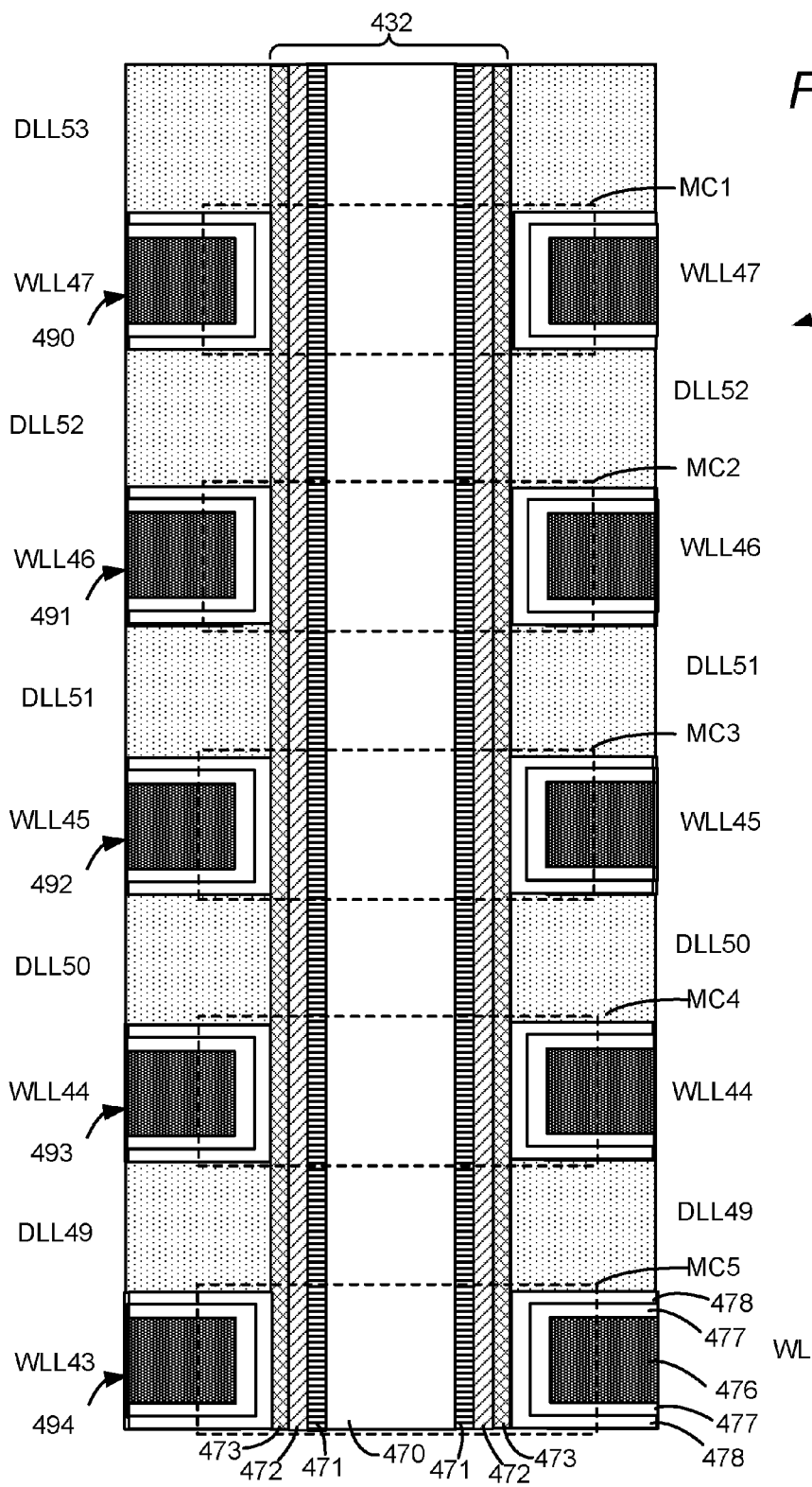
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
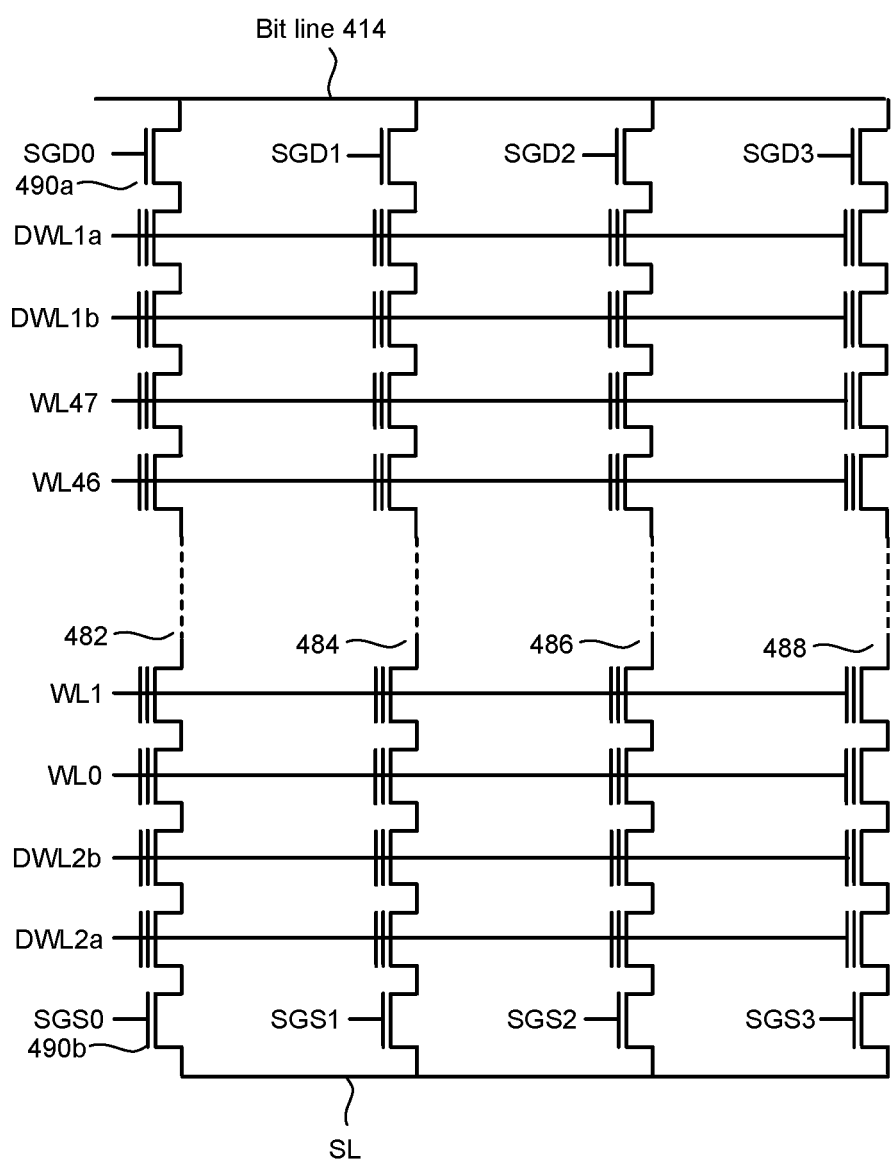
FIG. 4F is a schematic of a plurality of NAND strings.

FIG. 4F is a logical circuit diagram depicting a plurality of groups of connected programmable and erasable non-volatile memory cells arranged as four NAND strings 482, 484, 486 and 488 connected to bit line 414 and source line SL. The select lines SGD0, SGD1, SGD2, SGD3, SGS0, SGS1, SGS2, AND SGS3 are used to select/unselect the depicted NAND strings. In one embodiment all four drain side select lines (SGD0, SGD1, SGD2, SGD3) connect to each NAND string, but logically only one select line is used to select (actuate) each NAND strings. For example, SGD0 is used to select NAND string 482 to connect NAND string 482 to bit line 414 via drain select gate 490*a*, SGD1 is used to select NAND string 484 to connect NAND string 484 to bit line 414, SGD2 is used to select NAND string 486 to connect NAND string 486 to bit line 414, SGD3 is used to select NAND string 488 to connect NAND string 488 to bit line 414. Similarly, in one embodiment all four drain side select lines (SGS0, SGS1, SGS2, SGS3) connect to each NAND string, but logically only one select line is used to select (actuate) each NAND strings. For example, SGS0 is used to select NAND string 482 to connect NAND string 482 to common source line SL via source select gate 490*b*, SGS1 is used to select NAND string 484 to connect NAND string 484 to common source line SL, SGS2 is used to select NAND string 486 to connect NAND string 486 to common source line SL, SGS3 is used to select NAND string 488 to connect NAND string 488 to common source line SL. For example, to connect NAND string 482 to bit line 414, select gate 490*b* must be turned on (via select line SGD0) and to connect NAND string 482 to source line SL, select gate 490*b* must be turned on (via select line SGS0).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Adjacent data states are data states that are next to each other with respect to threshold voltage (or other attribute used to determine data value). For example, data states S3 and S4 are adjacent data states, and data states S6 and S7 are adjacent data states.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line.

FIG. 7 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 7 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
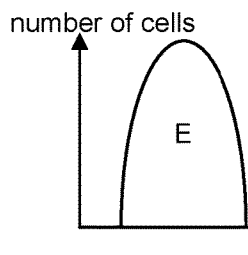
FIGS. 7A-7E show various threshold voltage distributions and describe a process for programming non-volatile memory.
Figure 7B:
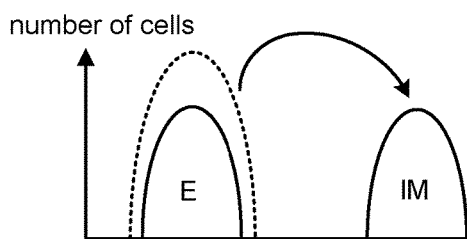

FIG. 5 shows a programming process that includes one phase where all memory cells connected to the same word line are programmed concurrently during that one phase. FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 7B. Memory cells being programmed to intermediate state IM are programmed to a target threshold voltage of VvIM.

Figure 7C:
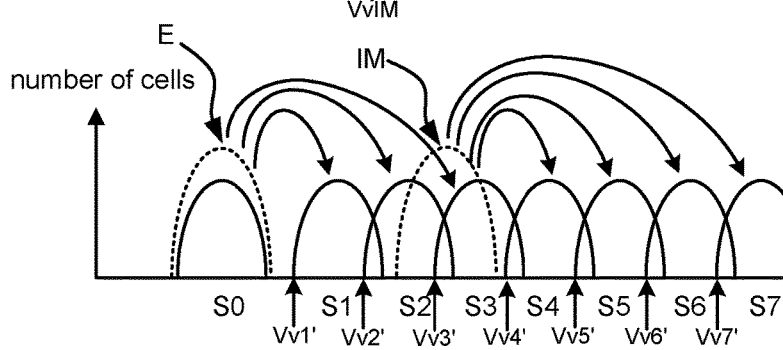
Figure 7D:
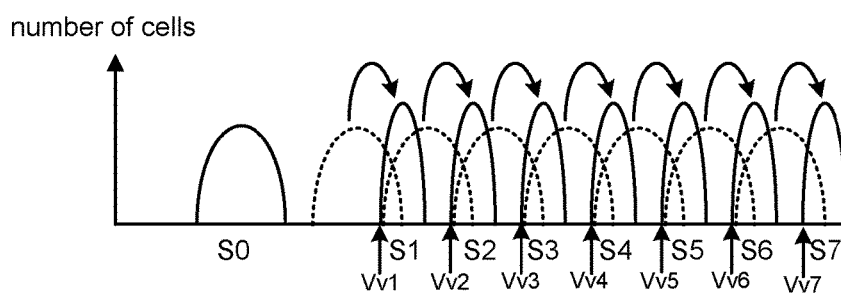
Figure 7E:
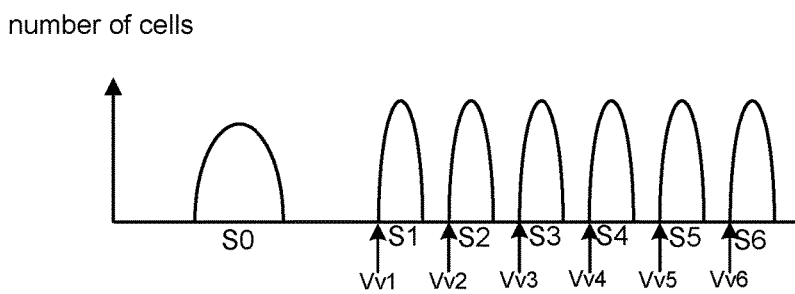

During the second phase of the programming process of FIGS. 7A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 7C.

As can be seen in FIG. 7C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 7D. The final result of the three phrase programming process is depicted in step 7E, which shows data states S0-S7. In some embodiments, data state S0 is wider than data states S1-S7. FIG. 7F shows one example of how data is encoded for the data states of FIGS. 5A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 8:
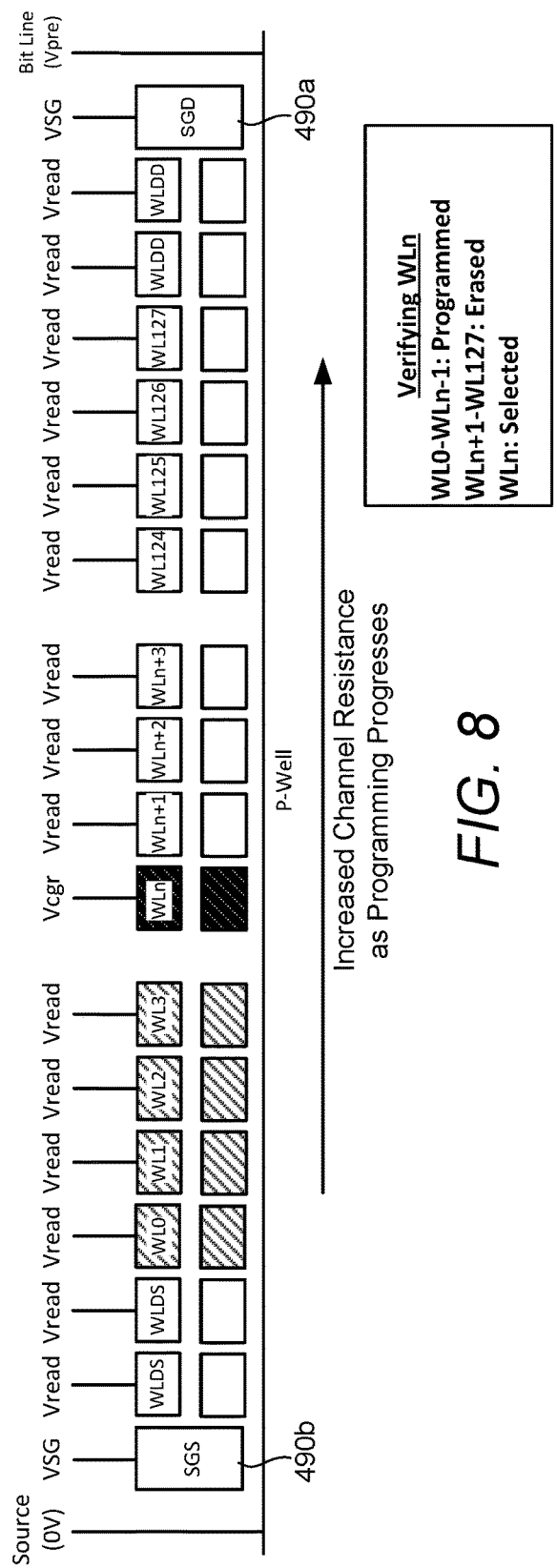
FIG. 8 is a cross-sectional view of an example of a NAND string illustrating the effects of programming on channel resistance.

FIG. 8 is a cross-sectional view of an example of a NAND string during sensing. The NAND string in this example includes 128 data word lines per block and four dummy word lines that are not used to store user data. Sensing may be performed during reading, program verification, monitoring, detecting, probing, etc. Sensing generally refers to any determination or approximation of a condition associated with a memory cell. Sensing may refer to determining the threshold voltage of a memory cell or one or more states corresponding to threshold voltages of a memory cell, with or without determining an actual threshold voltage of the memory cell. Typically sensing involves determining a memory cell's state based on one or more reference voltages or currents that are applied to the memory cell.

FIG. 8 depicts the bias condition of the NAND string when verifying a selected word line WLn. For example, the bias conditions of FIG. 8 can be used to apply the verify pulses shown in FIG. 6 at one of the very levels shown in FIG. 5. In general, during verify operations and read operations, the selected word line is connected to a voltage Vcgr (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

During a read or verify process, the unselected memory cells and dummy word lines are provided with one or more read pass voltages at their control gates so that these memory cells will operate as pass gates (e.g., conducting current regardless of whether they are programmed or erased). In FIG. 8, a single pass voltage Vread is applied to each of the unselected word lines. In one embodiment, Vread is approximately 6.0V, but any value of Vread may be used. Generally, Vread is a voltage that is higher than any threshold voltage to which a memory cell may be programmed. This may ensure that unselected memory cells and other elements of the string are conductive during sensing. Vread acts as an overdrive voltage because it causes the unselected storage elements to turn on and act as pass gates. Vread in many cases is the highest voltage that can be applied without causing disturbs. To limit read disturb on unselected word lines during sensing, the value of Vread may generally be set as low as possible to ensure that the memory cells are conductive and appropriately act as pass gates.

The source select line and drain select line are set to VSG to turn on source select gate 490b and drain select gate 490a. The NAND string is thus connected to the bit line and source line. The bit line is precharged to a level Vpre while the source line is grounded or set to 0V. In one example, Vpre is approximately 0.7V but other voltages may be used. Vpre is a precharge voltage for the bit line used during sensing. In the described example, the precharge voltage may be used to measure the conduction current of a storage element by determining whether the bit line discharges during a sense time. In another example, the precharge voltage may be held constant and the conduction current can be measured by the rate it discharges a dedicated capacitor in a sense amplifier.

The waveform of Vcgr applied to the selected word line may be considered a read pulse or a read reference voltage which is used during a sense operation. The voltage level of Vcgr varies according to the particular state being sensed. For example, Vcgr may be set to Vr1, Vr2, Vr3, etc. to sense at various target states during reading, or to Vv1, Vv2, Vv3, etc. to sense at various verify levels for target states during programming.

This biasing provides a conditional conduction path through the selected NAND string based on the threshold voltage of the selected memory cell and the applied level of Vcgr. The NAND string is allowed to control the bit line in order to sense the selected memory cell for the target state. A path is provided to dissipate the charge on the bit line through the NAND string. If the threshold voltage VTH of the selected memory cell of the NAND string for sensing is greater than Vcgr, then the selected memory cell will not turn on or otherwise be conductive from source to drain. The bit line (or sense amplifier capacitor) will not discharge. If the threshold voltage VTH of the selected memory cell is below Vcgr, then the selected memory cell will turn on and conduct from source to drain. The bit line will discharge. If a capacitor discharge technique is used, the bit line voltage will remain constant while the sense amplifier capacitor discharges to indicate a conductive memory cell. At some time following biasing, the sense amplifiers determine whether their associated bit lines (or sense capacitors) have discharged or otherwise dissipated by a sufficient amount. The sense amplifiers evaluate the BL or capacitor voltage to determine if the memory cell has a threshold above or below the compare point for the sense operation.

Programming for a block of memory cells coupled to word lines WL0-WL127 generally occurs in a programming order that begins at one end of each NAND string and proceeds to the other end. For example, programming may begin with word line WL0 nearest to the source line and end with word line WL127 nearest to the bit line. Similarly, programming may being with word line WL127 and end with WL0. In some examples, programming may be completed for a selected word line before proceeding to the next word line. In other examples, a first phase of programming for a selected word line WLn may be performed, followed by a first phase of programming for the next word line WLn+1. A second phase of programming may then be performed to complete programming for WLn, followed by a second phase of programming to complete programming for WLn+1. Additional phases may be used. In these instances, programming begins with a first word line such as WL0 and ends with a word line WL127. Programming proceeds in an order that completes programming of an earlier word line WL0, before completing programming for a subsequent word line WL1.

The conditions of a NAND string may vary as programming proceeds from the word lines nearest a first select line to the word lines nearest a second select line. One phenomenon that has been observed is the back-pattern effect which refers to an increase in the channel resistance of a NAND string as programming progresses for the NAND string. More specifically, the channel resistance of a NAND string tends to increase as programming progresses for a NAND string from source side word lines to drain side word lines (or the opposite if an opposite programming order is used). This increase in channel resistance decreases the channel conductance which can affect the apparent threshold voltage of the memory cells in the string. When a memory cell is programmed, its threshold voltage is raised. This increase in threshold voltage may decrease the channel resistance of the NAND string. As more memory cells are programmed, the channel resistance increases. The increase in channel resistance between the time the first memory cell is programmed and the last memory cells is programmed may be significant. A larger number of memory cells are programmed after an early programmed cell, which may significantly alter the NAND string conditions before the final memory cell is programmed. The increase in channel resistance can cause the later programmed memory cells to be programmed to a higher threshold voltage. Because the channel resistance is higher, the apparent threshold voltage of the cell will appear to be lower. The increased channel resistance results in a larger reference voltage being required to turn on the memory cells. Because of this, the later programmed memory cells may be programmed to higher levels which can cause a widening of the final threshold voltage distributions and potential read errors.

Consider the situation where the selected word line WLn is relatively close to the source line or source select gate 490b and programming proceeds generally from the source side to the drain side. If the selected word WLn is word line WL4 for example, only word lines WL0-WL3 have been programmed prior to programming word line WL4. In this case, four memory cells have been programmed prior to programming. Programming these memory cells may raise the threshold voltage of one or more memory cells of a NAND string connected to the word line based on the user data for the memory cell. These four memory cells, out of the 128 in each NAND string however, do not represent a large percentage of the memory cells of the NAND string. Therefore, the channel resistance of the NAND string will be relatively close to its level when programming began.

Now consider the situation where the selected word line WLn is relatively close to the bit line or drain select gate 490a. If the selected word line WLn is word line 120, for example, word lines WL0-WL119 have all been programmed prior to programming word line WL120. In this case, programming word lines WL0-WL119 raises the channel resistance of each NAND string. This may lead to programming the memory cells of WL120 to a higher threshold voltage than intended for a target state. A decreased channel conductance causes a lower current through each NAND string under the same bias conditions when compared to sensing when a smaller number of word lines had been programmed. This may result in programming the upper or later programmed word lines to higher threshold voltages. Additionally, after the block has been programmed, the threshold voltage of memory cells of the lower or earlier programmed word lines may appear to shift higher. The increased channel resistance may require a larger gate voltage for a selected memory cell to turn on and achieve the same level of channel current as when the channel resistance was lower prior to programming the other word lines for the string. Accordingly, the threshold voltage of these memory cells may appear to shift upward after programming the remaining word lines for the string.

In accordance with one embodiment, a variable pass voltage is applied to one or more unselected memory cells of a group in order to compensate for changes in channel resistance resulting from programming the group from one end (e.g., nearest a first select line) to another end (e.g., nearest a second select line). When sensing as part of a read or verify operation, the pass voltage applied to a subset of unselected memory cells can be varied based on the selected word line being read or verified. During verification, the pass voltage applied to the subset is generally lower when verifying an earlier programmed memory cell at one end of the group and higher when verifying a later programmed memory cell at another end of the group. The higher pass voltage applied to the subset of unselected memory cells when verifying a later programmed memory cell increases the channel conductance to compensate for the increase in channel resistance from programming. In this manner, overprogramming the later programmed memory cells may be avoided. The channel conductance is raised as a result of the higher pass voltage applied to the subset of unselected memory cells. The increase in channel conductance results in an increased channel current so that these memory cells are verified for their target state earlier than if the channel conductance were not increased. Programming the memory cells beyond the target verify level as a result of an increase in channel resistance may be avoided.

FIGS. 9A-9B are cross-sectional views of a group of memory cells depicting a set of variable bias conditions for a program verification operation according to one embodiment. FIG. 9A depicts an example set of bias conditions when programming word line WL124 and FIG. 9B depicts an example set of bias conditions when programming word line WL3.

In FIG. 9A, word line WL3 is selected for programming. The selected word line WL3 is connected to the reference voltage Vcgr. Vcgr may be equal to a verify voltage Vv1, Vv2, etc. The bit line is set to the precharge level Vpre for sensing and the source line is grounded. The source select gate 490b and drain select gate 490a are turned on by connecting both to VSG.

A read pass voltage Vread is applied to the unselected word lines WL0-WL2 that have programmed. Word lines WL0-WL2 are a subset of word lines that have been subjected to programming since a last erase operation. Word lines WL0-WL2 are positioned between the selected word line WL3 and the source select gate SGS. The memory cells connected to these word lines may be in the erased state or one or more programmed states (e.g., S1, S2, etc.). Vread can be about 6.0V in one embodiment but generally is set to a level sufficient to turn on a memory cell programmed to the highest level state. Other voltage levels for Vread may be used.

The read pass voltage Vread is also applied to the unselected word lines WL4-WL127 that have not been programmed. These word lines have not been programmed and thus, the memory cells connected to them will be in the erased state. It is possible, however, in multi-phase programming systems that word line WL4 may be in an intermediate programmed state or in a lower level programmed state before final programming. The pass voltage applied to the dummy word lines and word lines WL0-2 WL4-WL127 cause the corresponding memory cells to operate as pass gates so that sensing can be performed for the memory cell connected to word line WL3.

In FIG. 9B, word line WL124 is selected for programming and is connected to the reference voltage Vcgr. The bit line is set to the precharge level Vpre and the source line is grounded, while the select gates are turned on by connecting them to VSG. The read pass voltage Vread is applied to the unselected word lines WL125-WL127 that have not been programmed, similar to the bias conditions in FIG. 9A. These unselected word lines WL125-WL127 are on the drain side, or unprogrammed side, of the selected word line WL124. Word lines WL125-WL127 are positioned between the selected word line and the drain select gate SGD. These word lines, and the corresponding memory cells in each NAND string, may be referred to as drain-side word lines or memory cells. Generally, these word lines are unprogrammed, however, one or more of these word lines such as the adjacent word line WL125, may be at least partially programmed in some examples, such as where a multi-phase programming process is used. These word lines are a subset of the unselected word lines and have been subjected to programming.

Unselected word lines WL0-WL123 are connected to a second, different pass voltage Vread+100. These unselected word lines WL0-WL123 are on the source side, or programmed side, of the selected word line WL124. Word lines WL0-WL123 are positioned between the selected word line and the source select gate SGS. They have been subjected to at least partial programming prior to programming WL124. They have been subjected to programming since a last erase operation for the block. These word lines, and the corresponding memory cells in each NAND string, may be referred to as source-side word lines or memory cells. It is noted that WL0-WL123 is a set of word lines that includes the set of word lines WL0-WL2. Thus, the subset of word lines that receives the different pass voltage based on the position of the selected memory cell can vary based on the position of the selected word line.

In this example, the second pass voltage Vread+100 is higher than the first read pass voltage Vread by 100 mV. The larger pass voltage decreases the channel resistance of each corresponding NAND string, and thereby increases the channel conductance. As shown in FIG. 8, the channel conductance may decrease as programming progresses from one end of a NAND string to the other. The channel conductance may decrease as the threshold voltages of the source-side memory cells are raised due to previous programming. The larger pass voltage Vread+100 applied to the source-side word lines when verifying the later-programmed word line WL124 may compensate for the decreased channel conductance when verifying programming of word line WL124 relative to word line WL3. By reducing the channel resistance with a higher pass voltage, programming memory cells connected to word line WL124 beyond their target verify level due to a decreased channel conductance that results from the earlier programming can be avoided.

Additionally, the lower pass voltage applied to the subset of unselected word lines when programming word line WL3 may compensate for the increased channel resistance that occurs subsequent to programming word line WL3. After programming word line WL3, the channel resistance may rise from programming word lines WL4-127. The increased channel resistance may cause the threshold voltage of the memory cells of word line to appear to increase. A larger gate voltage may be required to turn the memory cells to the same level as during verification, due to the increased channel resistance. By using a lower read pass voltage when programming word line WL3, the memory cells will be programmed with a slightly higher threshold voltage when compared to the memory cells of a word line WL124 programmed using a higher read pass voltage.

In FIG. 9B, the read pass voltage applied to the source side word lines is greater than the nominal read pass voltage Vread which is applied to the drain side word lines. In another example, a lower read pass voltage such as Vread−100 may be used for the source side word lines when verifying the lower word line WL3 and the first read pass voltage Vread can be applied to the drain side word lines when verifying word line WL3. When verifying word line WL124, the source-side word lines receive the higher read pass voltage Vread and the drain-word lines receive the higher read pass voltage Vread. In another example, the source-side word lines may receive another voltage higher than the voltage applied when programming the lower word line WL3. For example, the source-side word lines may receive a voltage slightly higher or lower than Vread.

In one embodiment, a group of memory cells or word lines is divided into ranges or zones. The bias conditions during sensing vary based on the zone in which the selected word line is located. Specifically, the read pass voltage applied to at least a subset of the group of memory cells varies based on the selected word line being sensed. As illustrated in FIGS. 9A-9B, for example, verifying a word line such as word line WL3 in a lower or earlier programmed zone may include a read pass voltage for a subset of word lines on the source side of WL3 being set to a lower level. Verifying a word line such as word line WL124 in an upper or later programmed zone may include applying a read pass voltage for the subset of source side word lines that is higher than the read pass voltage when verifying a word line in the lower zone.

A group of memory cells can be divided or partitioned into zones in various ways. With reference to FIGS. 9A-9B, a simple example may include dividing a NAND string into two equal-sized zones. The first zone may include the first half of the word lines to be programmed according to the memory programming order, and the second zone may include the second half of the word lines to be programmed. For example, if the word lines are programmed in order from word line WL0 to WL127, the first zone may include word lines WL0-WL63 and the second zone may include word lines WL64-WL127. When verifying a selected word line in the first zone (e.g., WL3), a lower read pass voltage (e.g., Vread−100) is applied to a subset of unselected word lines on the already programmed (source) side of the selected word line. When verifying a selected word line in the second zone (e.g., WL124), a higher read pass voltage (e.g., Vread) is applied to the subset of unselected word lines on the source side of the selected word line.

In other examples, the size of the zones may not be equal or otherwise contain an equal number of word lines. Furthermore, more than two zones may be used. Any number of zones may be used, including a zone for each word line. When verifying a selected word line in a zone, the read pass voltage applied to the subset of unselected memory cells is higher than the read pass voltage that was applied when verifying a selected word line in any of the previously programmed zones.

FIG. 10 is a table depicting a set of bias conditions for verifying a group of memory cells connected to a group of word lines. The bias conditions may be used during the sense phase of a program verification operation for a NAND string. The bias conditions may be applied to simultaneously perform sensing for a plurality of NAND strings. The memory cells or a subset of the memory cells from a plurality of NAND strings connected to a selected word line WLn may be sensed.

FIG. 10 sets forth an example where the NAND string is divided into eight zones (or ranges). Each zone is set out in the upper row of the table and corresponds to one column in the table. Each zone column contains the bias conditions for sensing when the selected word line is in the corresponding zone. The leftmost column lists the nodes of the memory where the voltages are applied.

In this example, Zone 0 includes a first set of word lines from the group that are programmed first. Zone 1 includes a set of word lines that are programmed after the word lines in Zone 0. Zone 2 includes a set of word lines that are programmed from the group that are programmed after the word lines in Zone 1, etc. Consider an example including 128 word lines that are programmed in an order that begins with word line WL0 nearest to the source line (or source select gate) and ends with word line WL127 nearest the bit line (or drain select gate). Zone 0 may include word lines WL0-WL15, Zone 1 may include word lines WL16-31, Zone 2 may include word lines WL32-47, Zone 3 may include word lines WL48-WL63, Zone 4 may include word lines WL64-79, Zone 5 may include word lines WL80-WL95, Zone 6 may include word lines WL96-111, and Zone 7 may include word lines WL112-127. As earlier described, the divisions need not be equal such that the zones may not include the same number of word lines in all examples.

When verifying any of the word lines, the bit line is set to a precharge voltage Vpre, the source line is grounded, and the drain select line SGD and source select line SGS are set to VSG to couple the NAND string to the bit line and source line. The selected word line WLn is connected to the reference voltage Vcgr which may be Vv1, Vv2, Vv3, etc.

Turning to the first full column corresponding to Zone 0, the unselected word lines are connected to various read pass voltages so that they act as pass gates during sensing. On the drain side of the selected word line WLn, two different pass voltages are used in this example. The drain side word line WLn+1 that is adjacent to the selected word line WLn is connected to a voltage Vreadk. Vreadk is a highest read pass voltage used in one example. For example, Vreadk may be a few millivolts higher (e.g., 6.3V) than a standard read pass voltage Vread (e.g., 6.0V) that is used. The higher read pass voltage Vreadk may be used to guarantee that the channel regions around the selected word line WLn remain conductive during sensing. Because the selected word line is biased with the low level Vcgr for verification, the higher level of Vreadk can compensate for any reduced channel conductance of the memory cell at WLn+1 due to the lower voltage at word line WLn. In one embodiment, word line WLn+1 receives the same read pass voltage (e.g., Vreadl) that is applied to the other drain side unselected word lines.

A subset of the unselected drain side word lines including WLn+2 through WL127 receive a lower read pass voltage VreadL. VreadL is a lowest read pass voltage used in one example. For example, VreadL may be several millivolts less (e.g., 5.2V) than the standard read pass voltage Vread. The lower read pass voltage VreadL may be used because the word lines on the drain side have not undergone programming, and thus the corresponding memory cells should be in the erased state. Accordingly, a lower read pass voltage VreadL can be used while still ensuring that these memory cells operate as pass gates. Additionally, the lower level of VreadL may cause less read disturb whereby a memory cell is unintentionally programmed by the read pass voltage.

The source side word line WLn−1 that is adjacent to the selected word line WLn is connected to VreadK like word line WLn+1. The higher level of VreadK on WLn−1, along with the higher level on WLn+1, can compensate for any reduced channel conductance under memory cells at WLn+1 and WLn−1 due to the lower voltage at word line WLn. Word lines WLn+1 and WLn−1 are two word lines adjacent to the selected word line.

Each of the remaining source side word lines (e.g., WL0-WLn−2) comprising a subset of the unselected word lines on the source side of the selected word line WLn receive the variable read pass voltage. These word lines are labeled WL(source) in FIG. 10. When the selected word line is in Zone 0 (e.g., WL0-WL15), the unselected word lines on the source side receive a read pass voltage Vread−700. In this example, the Zone 0 read pass voltage is 700 mV less than the standard read pass voltage Vread that is used. Other values of the Zone 0 read pass voltage can be used. In one example, the Zone 0 read pass voltage is slightly higher than the lowest read pass voltage Vreadl that is used. In another example, the Zone 0 read pass voltage can be equal to the lowest read pass voltage that is used.

Zone 1 is adjacent to Zone 0 and includes word lines further from the source line than the word lines in Zone 0. The word lines in Zone 1 are programmed after the word lines in Zone 0. Zone 0 is located between Zone 1 and the source line (or source select gate). When the selected word line is in Zone 1 (e.g., WL16-WL31), the unselected word lines on the source side receive a read pass voltage Vread−600. When verifying a selected word line in Zone 1, the subset of unselected word lines that receive the variable pass voltage is larger than the subset of unselected word lines when the selected word line is in Zone 0.

In this example, the Zone 1 read pass voltage is 600 mV less than the standard read pass voltage Vread that is used.

The Zone 1 read pass voltage is 100 mV less than the read pass voltage Vread−700 mV that is applied to the source side word lines when verifying programming of a word line in Zone 0. In this manner, the read pass voltage for the subset of memory cells on the source side increases for a selected word line in the second zone. This increase corresponds with the position of the selected word line being further from the first select line (in this case the source line) and closer to the second select line (in this case the bit line). As more memory cells in a NAND string are programmed, the channel resistance of the string increases. By applying a read pass voltage to the subset of source side word lines that is higher, the increase in channel resistance can be offset or compensated for by an increase in channel conductance from a larger gate voltage for the unselected word lines on the source side.

The next column depicts the bias conditions when the selected word line is in Zone 2 (e.g., WL32-47). Zone 1 is adjacent to Zone 0 and Zone 2 and includes word lines located between the two zones. The Zone 2 read pass voltage is 500 mV less than the standard read pass voltage Vread. The Zone 2 read pass voltage is 100 mV less than the Zone 1 read pass voltage. Thus, the read pass voltage for the subset of memory cells on the source side is increased again when programming progresses to a selected word line in Zone 2. The further increase in channel resistance from the programming memory cells on word lines WL16-31 is compensated for by the increased gate voltage for the unselected source side memory cells when acting as pass gates for sensing.

When the selected word line is in Zone 3, (e.g., 48-63), the unselected word lines on the source side receive a read pass voltage Vread−400. The fourth pass voltage is 300 mV less than the standard read pass voltage Vread and 100 mV less than the third read pass voltage. The columns for Zones 4, 5, 6, and 7 show that the variable read pass voltage for the subset of word lines on the source side increases by 100 mV when programming progresses to a word line within each of the corresponding zones. The read pass voltage applied to the source side word lines increases to provide increased compensation as the channel resistance increases with the programming of additional memory cells.

For Zone 7 (e.g., WL112-WL127), the final read pass voltage is equal to Vread. As earlier described, Vread may generally be a voltage large enough to turn on a transistor with the highest programmable threshold voltage. In one embodiment, the read pass voltage (e.g., Vread−700) applied to the source side word lines when programming a selected word line in Zone 0 is high enough to turn on a memory cell programmed to a highest level for the memory system. In one embodiment, Vread is the read pass voltage applied when programming a word line in Zone 0. In that case, the read pass voltage applied to the source side word lines when programming a word line in Zone 1 can be larger than Vread (e.g., Vread+100), such as 100 mV higher in one example. The read pass voltage for subsequently programmed zones can be increased similarly.

In FIG. 10, the word lines that receive the variable read pass voltage include all of the source side word lines except for the word line WLn−1 that is immediately adjacent to the selected word line. This subset of unselected word lines is each word line of the group except for WLn−1 that is positioned between the selected word line and the source select gate and has been subjected to programming after erase and prior to programming the first memory cell. The subset of unprogrammed word lines can include more or less than the subset shown in FIG. 10. For example, the subset can include all of the unselected word lines on the source side of the selected word line. In another example, the subset may be fewer than one less than the total number of unselected word lines on the source side.

In FIG. 10, the subset of source side unselected word lines that receives the variable pass voltages changes with the selected word line. The number of word lines in the subset increases as the selected word line progresses toward the bit line. For example, the subset includes word lines WL0, WL1, and WL2 when programming and verifying word line WL4. The subset includes word lines WL0, WL1, WL2, and WL3 when programming and verifying word line WL5. Thus, word lines WL0, WL1, and WL2 may be referred to as a first set of word lines and word lines WL0, WL1, WL2, and WL3 a second set of word lines that includes the first set and an additional word line (WL3). Nevertheless, the same word line or subset of word lines will receive different read pass voltages as the selected word line changes. Word lines WL2 and WL3 receive VreadL when verifying word lines WL0 and WL1, but receive Vread−700 when verifying word lines WL3-WL127.

As earlier described, the number of zones can vary by implementation. In one example, two zones of equal sizes are used. In another example, each word line is its own zone. For example, if 64 word lines are used, then 64 zones can be used, and 63 different read pass voltages for the subset of word lines on the source side can be used.

In FIG. 10, the read pass voltage for the subset of source-side word lines increases by an equal amount between each of the zones for the selected word line. In another embodiment, unequal increases in the read pass voltage from zone to zone may be used. For example, the read pass voltage for Zone 1 may be 120 mV higher than the read pass voltage for Zone 0 and the read pass voltage for Zone 2 may be 80 mV higher than the read pass voltage for Zone 1. Any combination and difference between read pass voltages may be used with an increase in the read pass voltage for zones further from the starting select line.

In FIG. 10, the drain side word lines receive a constant read pass voltage that does not vary as the selected word line zone varies. In another embodiment, a variable pass voltage can be applied to one or more unselected word lines on the drain side of the selected word line. This technique may be used in combination with a variable read pass voltage on the source side or independently of such a method.

FIG. 11 depicts one example of a subset of unselected word lines on the drain side of a selected word line receiving a read pass voltage that varies with the position of the selected word line. The unselected word lines on the drain side that receive the variable read pass voltage are labeled WL(drain). In this example, the subset of word lines receiving the variable read pass voltage includes WLn+2-WL127. WLn+1 receives the highest pass voltage VreadK. In another example WLn+1 adjacent to the selected word line may receive a variable read pass voltage.

When the selected word line is in Zone 0 (e.g., WL0-WL15), the unselected word lines on the drain side receive a read pass voltage Vread−700. In this example, the Zone 0 read pass voltage is 700 mV lower than the read pass voltage VreadL that is used for the drain side word lines. When the selected word line is in Zone 1 (e.g., WL16-WL31), the unselected word lines on the drain side receive a read pass voltage Vreadl−600. In this example, the Zone 1 read pass voltage is 600 mV lower than the read pass voltage Vreadl. When the selected word line is in Zone 2, the read pass voltage is increased another 100 mV to VreadL-500 mV. The read pass voltage for the drain side unselected word lines continues to increase by 100 mV as the selected word line moves from through each zone to the final word line WL127. As with the variable source side pass voltage, the drain side pass voltage may utilize unequal increments between the voltages for each zone. Moreover, variable zone sizes may be used that do not necessarily correspond with those of the source side divisions of the selected word line for determining when to increase the pass voltage. In one example, Vread–700 is slightly larger than Vreadl. In another example, the source side pass voltage Vread–700 and the drain side pass voltage Vreadl are the same. In other examples, these values do not have to be the same.

In another example, the variable read pass voltages for the drain side unselected word lines are the same as the variable read pass voltages for the source side unselected word lines. Other voltages, increments, and partitions of the word lines and memory cells into zones may be used.

FIGS. 12A-12H are cross-sectional views of an example of a NAND string depicting the bias conditions for the NAND string during program verification. FIGS. 12A-12H depict the floating gates (FG) and overlying word lines connected to each memory cell of the NAND string. The voltages applied to the word lines during program verification are depicted. The NAND string in this example includes 32 data word lines per block (dummy word lines are not shown but may be included). The memory cells of the NAND string and the word lines are partitioned into eight zones in this example, with four memory cells or word lines in each zone. Zone 0 includes word lines WL0-WL3, Zone 1 includes word lines WL4-WL7, Zone 2 includes word lines WL8-WL11, Zone 3 includes word lines WL12-WL15, Zone 4 includes word lines WL16-WL19, Zone 5 includes word lines WL20-WL23, Zone 6 includes word lines WL24-WL27, and Zone 6 includes word lines WL28-WL31. Other examples may include different numbers of word lines, different numbers of zones, as well as different numbers of word lines within the individual zones of one implementation.

FIGS. 12A-12H depicts the bias conditions for the NAND string when verifying a selected word line WLn. Box 602 sets for the voltages applied to each word line which are denoted above the corresponding word lines by crosshatching. Similarly, box 604 sets forth the floating gate and word line designations by cross-hatching to differentiate between floating gates that have been subjected to programming (programmed) and that have not been subjected to programming (unprogrammed), and word lines that are unselected or selected for the current verification.

FIG. 12A depicts the NAND string when word line WL2 in Zone 0 is selected for verification. In this case, word line WL2 receives the reference voltage Vcgr such as a verify level Vv1. The two adjacent word lines WL1 and WL3 each receive the high read pass voltage Vreadk. The drain side unselected word lines WL4-WL31 receive the low read pass voltage Vreadl. A subset of unselected source side word lines including word line WL0 receives the variable read pass voltage. In the case of FIG. 14a for Zone 0, the variable read pass voltage is Vread–700 which is the lowest variable read pass voltage. Vread–700 may be slightly larger than Vreadl in one embodiment. In another example, Vread–700 may be slightly lower than Vreadl or equal to Vreadl.

FIG. 12B depicts the NAND string when word line WL7 in Zone 1 is selected for verification. Word line WL7 receives the reference voltage Vcgr. The two adjacent word lines WL6 and WL8 each receive the high read pass voltage Vreadk. A subset of the drain side unselected word lines including word lines WL9-WL31 receive the low read pass voltage Vreadl. A subset of the unselected source side word lines including word lines WL0-WL6 receives the variable read pass voltage. For Zone 1, the variable read pass voltage for word lines WL0-WL6 is Vread–600. Vread–600 is 100 mV higher than the variable read pass voltage applied when the selected word line is in Zone 0.

FIG. 12C depicts the NAND string when word line WL9 in Zone 2 is selected for verification. Word line WL9 receives the reference voltage Vcgr and the adjacent unselected word lines WL8 and WL10 each receive the high read pass voltage Vreadk. A subset of the drain side unselected word lines including word lines WL11-WL31 receive the low read pass voltage Vreadl. A subset of the unselected source side word lines including word lines WL0-WL8 receive the variable read pass voltage. For a selected word line in Zone 2, the variable read pass voltage for word lines WL0-WL8 is Vread–500. Vread–500 is 100 mV higher than the variable read pass voltage applied to when the selected word line is in Zone 1.

In FIG. 12D, WL12 in Zone 3 is selected for verification and receives Vcgr. The adjacent unselected word lines WL11 and WL12 receive Vreadk. A subset of the drain side unselected word lines including word lines WL13-WL31 receive the low read pass voltage Vreadl. A subset of the unselected source side word lines including word lines WL0-WL11 receive the variable read pass voltage. For a selected word line in Zone 3, the variable read pass voltage for word lines WL0-WL10 is Vread–400. Vread–400 is 100 mV higher than the variable read pass voltage applied to when the selected word line is in Zone 2.

In FIG. 12E, WL18 in Zone 4 is selected for verification and receives Vcgr. The adjacent unselected word lines WL17 and WL19 receive Vreadk and unselected word lines WL20-WL31 receive the low read pass voltage Vreadl. A subset of the unselected source side word lines including word lines WL0-WL16 receive the variable read pass voltage. For a selected word line in Zone 4, the variable read pass voltage for word lines WL0-WL16 is Vread–300. Vread–300 is 100 mV higher than the variable read pass voltage applied to when the selected word line is in Zone 3.

In FIG. 12F, WL21 in Zone 5 is selected for verification and receives Vcgr. The adjacent unselected word lines WL20 and WL22 receive Vreadk and unselected word lines WL23-WL31 receive the low read pass voltage Vreadl. A subset of the unselected source side word lines including word lines WL0-WL19 receive the variable read pass voltage. For a selected word line in Zone 5, the variable read pass voltage for word lines WL0-WL19 is Vread–200. Vread–200 is 100 mV higher than the variable read pass voltage applied to when the selected word line is in Zone 4.

In FIG. 12G, WL24 in Zone 6 is selected for verification and receives Vcgr. The adjacent unselected word lines WL23 and WL25 receive Vreadk and unselected word lines WL26-WL31 receive the low read pass voltage Vreadl. A subset of the unselected source side word lines including word lines WL0-WLWL22 receive the variable read pass voltage. For a selected word line in Zone 6, the variable read pass voltage for word lines WL0-WL22 is Vread–100. Vread–200 is 100 mV higher than the variable read pass voltage applied to when the selected word line is in Zone 5.

In FIG. 12H, WL28 in Zone 7 is selected for verification and receives Vcgr. The adjacent unselected word lines WL27 and WL29 receive Vreadk and unselected word lines WL30-WL31 receive the low read pass voltage Vreadl. A subset of the unselected source side word lines including word lines WL0-WLWL26 receive the variable read pass voltage. For a selected word line in Zone 7, the variable read pass voltage for word lines WL0-WL26 is Vread. Vread is 100 mV higher than the variable read pass voltage applied to when the selected word line is in Zone 6.

A variable read pass voltage can be used when sensing as part of a read operation as well. The variable read pass voltages used when reading may be used in conjunction with a variable read pass voltage used when sensing as part of a verification operation or independently of any variable read pass voltage used during verification. FIG. 13 is a table depicting a set of bias conditions for reading a group of memory cells connected to a group of word lines after the group has been subjected to programming. The bias conditions may be used during the sense phase of a reading operation for a NAND string. The bias conditions may be applied to simultaneously perform sensing for a plurality of NAND strings. The memory cells or a subset of the memory cells from a plurality of NAND strings connected to a selected word line WLn may be sensed.

FIG. 13 continues with the example from FIG. 11 where a NAND string is divided into eight zones (or ranges). For example, the NAND string may be connected to 128 word lines that are programmed in an order that begins with word line WL0 and ends with word line WL127. Zone 0 may include word lines WL0-WL15, Zone 1 may include word lines WL16-31, Zone 2 may include word lines WL32-47, Zone 3 may include word lines WL48-WL63, Zone 4 may include word lines WL64-79, Zone 5 may include word lines WL80-WL95, Zone 6 may include word lines WL96-111, and Zone 7 may include word lines WL112-127. As earlier described, the divisions need not be equal such that the zones may not include the same number of word lines in all examples.

When reading any of the word lines, the bit line is set to a precharge voltage Vpre, the source line is grounded, and the drain select line SGD and source select line SGS are set to VSG to couple the NAND string to the bit line and source line. The selected word line WLn is connected to the reference voltage Vcgr which may be Vr1, Vr2, Vr3, etc.

During reading, the drain side word line WLn+1 that is adjacent to the selected word line WLn is connected to Vreadk. In one embodiment, word line WLn+1 receives the same read pass voltage (e.g., Vread) that is applied to the other drain side unselected word lines. A subset of the unselected drain side word lines including WLn+2 through WL127 receive a standard read pass voltage Vread. Because all of the word lines have been programmed when reading is performed, a lower read pass voltage VreadL is not used as during verification.

The source side word line WLn−1 that is adjacent to the selected word line WLn is connected to Vreadk like word line WLn+1. A subset of the unselected word lines on the source side (e.g., WL0-WLn−2) of the selected word line WLn receive the variable read pass voltage that is dependent on the position of the word line that is selected for reading. These word lines are labeled WL(source) in FIG. 13. When the selected word line is in Zone 0 (e.g., WL0-WL15), the unselected word lines on the source side except for WLn−1 receive the standard read pass voltage Vread. In this example, the Zone 0 read pass voltage Vread may be 6.0V but other values may be used.

The word lines in Zone 1 are programmed after the word lines in Zone 0. In this example, the Zone 1 read pass voltage Vread−100 is 100 mV lower than the standard read pass voltage Vread that is used when reading a word line in Zone 0. In this manner, the read pass voltage for the subset of memory cells on the source side decreases for a selected word line in the second zone. This decrease corresponds with the position of the selected word line being further from the first select line (in this case the source line) and closer to the second select line (in this case the bit line).

As earlier explained, as more memory cells in a NAND string are programmed, the channel resistance of the string increases. Thus, after programming the word lines in Zone 0, the memory cells of the word lines in the remaining zones (e.g., WL16-127) are programmed. This increases the channel resistance of the NAND string when compared to the resistance of the channel when the memory cells were first programmed.

Accordingly, the highest read pass voltage for the source side unselected word lines may be used when reading a selected word line in Zone 0. This highest pass voltage will lower the channel resistance to compensate for the increase in channel resistance that occurred after programming the memory cells in Zone 0. The increase in channel resistance from programming the word lines after those in Zone 0 causes the threshold voltage of the memory cells in Zone 0 to appear to increase. The higher read pass voltage applied when reading the memory cells in Zone 0 will cause the apparent threshold voltage of these memory cells to decrease back to the level when they were originally programmed.

The memory cells in Zone 1, however, have fewer word lines programmed after them when compared with the memory cells in Zone 0. The memory cells in Zone 0 are already programmed when programming Zone 1 such that fewer memory cells will be programmed after the memory cells in Zone 1. In this manner, the channel resistance is already higher when programming the memory cells in Zone 1. The channel resistance will increase after programming the memory cells in Zone 1. The increase, however, will be less than that experienced by the memory cells in Zone 0. Accordingly, the read pass voltage applied to the source side unselected word lines when reading in Zone 1 is lower than when reading in Zone 0 to provide less compensation for the increase in channel resistance.

The word lines in Zone 2 are programmed after the word lines in Zone 1. The variable read pass voltage applied to the subset of source side unselected word lines is lowered again when reading in Zone 2. In this example, the Zone 2 read pass voltage Vread−200 is 100 mV lower than the standard read pass voltage Vread that is used when reading a word line in Zone 0. The memory cells of Zone 0 and 1 have been programmed when programming the memory cells of Zone 2. Thus, fewer memory cells will be programmed after programming the cells in Zone 2, when compared to the later programming done after programming the memory cells in Zone 0 or Zone 1. Accordingly, the read pass voltage for Zone 2 is lowered again from the level used when reading in Zone 1. Although the same differential between the read pass voltages for the different Zones is shown in FIG. 13, other example may vary the read pass voltage between zones by different amounts.

When reading a word line in Zone 3, the variable read pass voltage applied to the subset of unselected source side word lines is equal to Vread−300. The lower pass voltage provides less compensation for an increase in channel resistance. Fewer memory cells are programmed after the memory cells in Zone 3 such that a lower compensation is provided to approximate the increase the channel resistance since programming for Zone 3. The variable read pass voltage applied to the subset of source side unselected word lines decreases when reading a selected word line in each subsequent zone. For Zone 7, for example, the final read pass voltage applied on the source side is Vread−700. It is noted that the variable read pass voltages applied during reading do not have to be the same voltages or be lowered by the same amount as the variable read pass voltages during verification. However, the variable read pass voltages are lower for the subset of unselected source side word lines when reading later programmed word lines than when reading the earlier programmed word lines. This may be contrasted with the variable read pass voltages during verification which are higher when verifying later programmed word lines than when verifying the earlier programmed word lines.

It is noted that a variable read pass voltage during read operations is not required. For example, one embodiment includes using variable read pass voltages for a subset of word lines during verification as shown in FIG. 11, but uses a constant read pass voltage for the subset of word lines during reading. For example, the subset of source side unselected word lines may receive a constant voltage Vread when reading in any zone in one embodiment.

Figure 14:
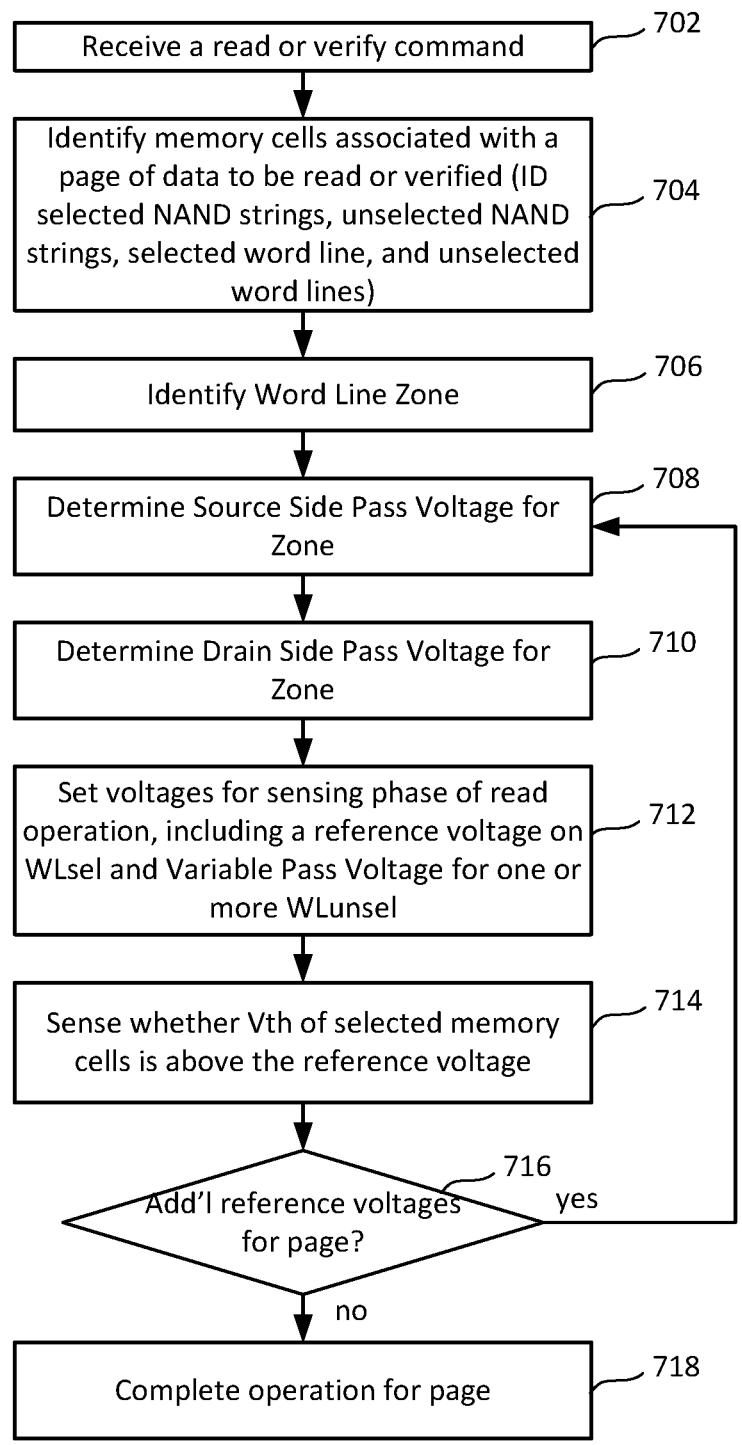
FIG. 14 is a flowchart describing a process of sensing for a page of non-volatile memory cells in one embodiment.

FIG. 14 is a flowchart describing a process of sensing in response to read or verify command in one embodiment. In one example, the process of FIG. 14 may be performed by a non-volatile storage system, such as non-volatile storage system 100 in FIG. 3. The process of FIG. 16 can be performed by state machine 112, control circuitry, controller 122 and/or any of the one or more control circuits described above.

At step 702, the system receives a read or verify command. A read command may be a read command received from a host, or a read command passed internally within the storage system, for example between controller 122 and R/W circuits 128 and/or control circuitry 110. The read command may specify a memory address or a range of memory addresses to be read from the non-volatile storage system. At step 704, a plurality of memory cells is identified in response to receiving the read or verify command. The plurality of memory cells may be associated with a page of data to be read or verified. The plurality of memory cells may be a set of memory cells connected to a common word line. The plurality of memory cells may include a first memory cell that is part of a first NAND string or another group of connected memory cells. The NAND memory array may include a NAND flash memory structure, such as a vertical NAND structure or a bit cost scalable (BiCS) NAND structure. By way of non-limiting example, the page of data may comprise 1 KB or 2 KB of data. Identifying the plurality of the memory cells can include identifying selected NAND strings, unselected NAND strings, selected word lines, and unselected word lines in one embodiment. For example, the selected word line may be a selected word line layer in a stacked 3D memory device, and the unselected word lines may include the remaining word line layers. Although the process of reading or verifying a single page of data is described, additional pages may be identified at step 704 and read or verified concurrently or in sequence with the described page using steps 704-718.

At step, 706, the system identifies a word line zone for the sense operation. The system may identify the word line associated with the sense operation and determine the word line zone for the word line. As earlier described, any number of zones may be use. In one example, step 706 only includes determining the word line for the sense operation. For example, each word line may be its own zone, or the system may store or be configured to apply the appropriate bias conditions based on the word line of the sense operation.

At step 708, the system determines the variable source side pass voltage to apply to the unselected source side word lines during the sense operation for the selected word line. Step 708 may include determining the source side pass voltage for the word line or word line zone associated with the sense operation. Step 708 may include determining the source side pass voltage that is used for a subset of the source side unselected word lines or may include determining a source side pass voltage for all of the source side unselected word lines.

At step 710, the system determines the variable drain side pass voltage to apply to the unselected drain side word lines during the sense operation for the selected word line. Step 710 may include determining the drain side pass voltage for the word line or word line zone associated with the sense operation. Step 710 may include determining the drain side pass voltage that is used for a subset of the drain side unselected word lines or may include determining a drain side pass voltage for all of the drain side unselected word lines.

In one embodiment, step 710 includes using a constant drain side pass voltage for all word line zones. For example, the system may apply a constant drain side read pass voltage while the source side read pass voltage is varied for at least a subset of the unselected word lines on the source side. The system may program the word lines for a block that begins with a word line nearest a source line and ends with a word line nearest a bit line using a constant drain side pass voltage and a variable source side pass voltage. In another embodiment, step 708 includes using a constant source side pass voltage. For example, the system may apply a constant source side read pass voltage for each zone while the drain side read pass voltage is varied for a least a subset of the unselected word lines on the drain side. The system may program the word lines for a block that begins with a word line nearest a bit line and ends with a word line nearest a source line using a constant source side pass voltage and a variable drain side pass voltage. Steps 708 and 710 may also include determining other drain and source side pass voltages, such as a larger read pass voltage Vreadk that is applied to word lines adjacent to the selected word line.

At step 712, the system sets the voltages for the sensing phase of the operation. The system may first initialize voltages for the sense operation. For example, the system can initialize various select gates, word lines, bit lines, and source lines to voltages to begin the operation. Step 712 includes setting a read reference voltage or verify reference voltage for the selected word line during the sense phase corresponding to a state being read or verified. For example, the system may apply Vr1, Vr2, Vv1, Vv2, etc. as shown in FIG. 5 to a selected word line at step 712. Step 712 may also include setting various read pass voltages, select gate, bit line, and source line voltages. The system applies the read pass voltages determines for the source side unselected word lines and drain side unselected word lines at steps 708 and 710, respectively.

At step 714, the system senses whether the threshold voltages of the selected memory cells are above the reference voltage. After biasing the memory for reading or verifying, the system senses a current through each selected NAND string for a sense time.

At step 716, the system determines whether there are additional reference voltages to be applied for the page. If so, the process returns to step 708 to determine the source side pass voltage for the word line zone at the next reference voltage. In one embodiment, the applies the same read pass voltages when sensing at each reference voltage such that steps 708 and 710 are not performed before sensing for each state. In another embodiment, the read pass voltages may also vary based on the state or reference voltage for which sensing is performed.

FIG. 15 is a block diagram of one example of a set of components that can perform the process of FIG. 14. FIG. 5 is also an example of components that can be used to apply to and/or generate a variable read pass voltage for a subset of unselected word lines of a group based on the word line selected for sensing. FIG. 15 depicts control circuit 650 in communication with non-volatile memory cells 126. In one embodiment, memory cells 126 can include memory cells in a two dimensional structure or three dimensional structure (e.g., such as the structure depicted in FIGS. 4A-F). Any of various non-volatile technologies known in the art can be used to implement memory cells 126.

Control circuit 650 includes sense circuit 652, program circuit 654, program verification circuit 656, and read circuit 658. Sense circuit 652, in one embodiment, includes program verification circuit 656 and/or read circuit 658. Sense circuit 652 is connected to the memory cells and is configured to perform a sense process as part of reading or verifying for the memory cells, as described herein. In one embodiment, sense circuit 652 performs step 702-718. In another embodiment, one or more of steps 702-718 may be performed by program circuit 654, program verification circuit 656, and/or read circuit 658. Sense circuit may be used for sensing as parting of reading, verifying, monitoring, probing, or any other process that determines a memory cell's state or condition.

Sense circuit 652 is configured to sense a programmed state of one or more memory cells. Various means for sensing (sensing means) may be used to determine a programmed state of a selected memory cell. The sense circuit may be a part of or include read circuit 658 and/or program verification circuit 656 in one embodiment. The sensing means may include a dedicated circuit within control circuit 650 in one embodiment. The sensing means may also or alternately include software control means implemented with a processor or logic circuitry for example. The sensing means may include reading means for performing multiple read operations to read various pages of data from a selected set of memory cells. The reading means may include means for applying one or more sets of read reference voltages to the selected memory cells in order to determine a programmed state of the selected memory cells. The reading means may apply to a selected word line one or more of a plurality of read reference voltages associated with a particular page of data in association with a read operation after current generation means generates a current in the channel for one or more groups of memory cells. The sensing means may include verifying means for performing multiple verify operations to verify one or more pages of data. In one embodiment, the sensing means performs steps 702-718 of FIG. 14. In another embodiment, the sensing means performs steps 714 and the other steps of FIG. 14 are performed by other circuits such as the read and verify circuits, based on the memory operation being performed.

Read circuit 658 is configured to read groups of memory cells, such as a page of data from a page of memory cells in non-volatile memory cells 126. Read circuit 658 is one example of a reading means. Various means for reading non-volatile memory cells may be used. The reading means may include a dedicated circuit, such as a dedicated circuit within control circuit 650 in one example. The reading means may also or alternately include software control means implemented with a process or logic circuitry for example. In one embodiment, the reading means performs steps 702-718 of FIG. 14 for a read operation. In another embodiment, the reading means performs the control steps 702-712 and 716-718, while the sensing means performs step 714.

Program circuit 654 is configured to program groups of memory cells, such as a page of data to a page of memory cells in non-volatile memory cells 126. Program circuit 656 is one example of a programming means. Various means for programming non-volatile memory cells may be used. The programming means may include a dedicated circuit, such as a dedicated circuit within control circuit 650 in one example. The programming means may also or alternately include software control means implemented with a process or logic circuitry for example.

Program verification circuit 656 is configured to sense groups of memory cells, such a page of data from a page of memory cells in non-volatile memory cells 126. Program verification circuit 656 can perform verification in between programming pulses applied by program circuit 654 in one embodiment. Verification circuit 656 is one example of a program verification means. Various means for verifying non-volatile memory cells may be used. The verifying means may include a dedicated circuit, such as a dedicated circuit within control circuit 650 in one example. The verifying means may also or alternately include software control means implemented with a process or logic circuitry for example. In one embodiment, the verifying means performs steps 702-718 of FIG. 16 for a verify operation. In another embodiment, the verification means performs the control steps 702-712 and 716-718, while the sensing means performs step 714.

Different read pass voltages may also be applied to one or more subsets of memory cells from a group such as a NAND string, based on the state or reference voltage being sensed in addition to the position of a selected word line within the group.

FIGS. 16A and 16B depict tables including a set of bias conditions for verifying a group of memory cells connected to a group of word lines using state and selected word line dependent read pass voltages. The bias conditions may be used during the sense phase of a program verification operation for a NAND string. The bias conditions may be applied to simultaneously perform sensing for a plurality of NAND strings. The memory cells or a subset of the memory cells from a plurality of NAND strings connected to a selected word line WLn may be sensed.

In this example, there are 48 data word lines that are programmed beginning with word line WL0 and ending with word line WL47. FIGS. 16A-16B depict an example where the NAND string is divided into six zones for determining a read pass voltage when sensing for states S1, S2, S3, S4, S5, and S6, and is divided into twelve zones for determining a read pass voltage when sensing for state S7. Thus, the system may use different zones with different numbers of word lines or memory cells in the zones sensing for different states. In this example, a higher sensitivity to the read pass voltage may be experienced by the memory cells when programming to the highest level state. Accordingly, additional zones are used when sensing at the highest level state to provide more precise biasing to control the channel conductance.

As earlier described, when verifying any of the word lines, the bit line is set to a precharge voltage Vpre, the source line is grounded, and the drain select line SGD and source select line SGS are set to VSG to couple the NAND string to the bit line and source line. The selected word line WLn is connected to the reference voltage Vcgr which may be Vv1, Vv2, Vv3, etc.

FIG. 16A depicts the unselected word line read pass voltages applied to the word lines for a block of memory cells when sensing for states S1-S6. FIG. 16B depicts the unselected word line read pass voltages when sensing for state S7. Generally, the system applies higher read pass voltages when sensing for the lower level states, and lower read pass voltages when sensing for the higher level states. It has been observed that memory cells programmed to the highest level states may show the greatest variability in threshold voltage or the widest distribution. Accordingly, a lower read pass voltage may be used when programming to the higher level state. The lower read pass voltage may cause the cells at the highest level state to be programmed to a slightly lower threshold voltage. After the increased channel resistance from subsequent programming of additional word lines, the threshold voltage of the memory cell may appear to increase and be more close to within the intended range.

With reference to FIG. 16A, the system applies the low read pass voltage VreadL to the unselected drain side word lines WLn+2 to WL47 when the selected word line is in any of the zones Zone 0-Zone 5. The system applies the high read pass voltage VreadK to word lines WLn+1, WLn−1 which are adjacent to the selected word line WLn. The unselected source side word lines receive a variable pass voltage that is dependent on the word line zone of the selected word line.

A subset of the unselected word lines on the source side (e.g., WL0-WLn−2) of the selected word line WLn receive the variable read pass voltage that changes based on the position of the word line that is selected for verification. These word lines are labeled WL(source) in FIG. 19A. When the selected word line is in Zone 0 (e.g., WL0-WL7), the unselected word lines on the source side receive a read pass voltage Vread−62.5. In this example, the Zone 0 read pass voltage is 62.5 mV less than the standard read pass voltage Vread that is used. Other values of the Zone 0 read pass voltage can be used. In one example, the Zone 0 read pass voltage is higher than the lowest read pass voltage Vreadl that is used.

When the selected word line is in Zone 1 (e.g., WL8-WL15), the unselected word lines on the source side receive a read pass voltage Vread−50. In this example, the Zone 1 read pass voltage is 50 mV less than the standard read pass voltage Vread that is used. The Zone 1 read pass voltage is higher than the read pass voltage that is applied to the source side word lines when verifying programming of a word line in Zone 0. The read pass voltage for the subset of memory cells on the source side increases for a selected word line in the second zone. This increase corresponds with the position of the selected word line being further from the first select line (in this case the source line) and closer to the second select line (in this case the bit line)

When the selected word line is in Zone 2 (e.g., WL16-23), the read pass voltage for the subset of unselected source wide word lines is 37.5 mV less than the standard read pass voltage Vread. When the selected word line is in Zone 3, (e.g., WL24-31), the unselected word lines on the source side receive a read pass voltage Vread−25. The fourth pass voltage is 25 mV less than the standard read pass voltage Vread. When the selected word line is in Zone 4, (e.g., WL32-39), the unselected word lines on the source side receive a read pass voltage Vread−12.5. When the selected word line is in Zone 5, (e.g., WL40-47), the unselected word lines on the source side receive a read pass voltage Vread. The variable read pass voltage for the subset of word lines on the source side increases as programming progresses to a word line within each of the corresponding zones. The read pass voltage applied to the source side word lines increases to provide increased compensation as the channel resistance increases with the programming of additional memory cells.

For Zone 7 (e.g., WL112-WL127), the final read pass voltage is equal to Vread. As earlier described, Vread may generally be a voltage large enough to turn on a transistor with the highest programmable threshold voltage.

With reference to FIG. 16B, the system applies similar bias when sensing for the highest level state, state S7 in this example. However, the variable read pass voltages applied to the unselected source side word lines are lower than those applied when sensing for the lower level states. The system applies VreadL to the unselected drain side word lines WLn+2 to WL47 when the selected word line is in any of the zones, applies VreadK to word lines WLn+1, WLn−1, and applies a variable pass voltage that is dependent on the word line zone of the selected word line.

The subset of the unselected word lines on the source side (e.g., WL0-WLn−2) of the selected word line WLn receive the variable read pass voltage that changes based on the position of the word line that is selected for verification. When the selected word line is in Zone 0, (e.g., WL0-3), the unselected word lines on the source side receive a read pass voltage Vread−137.5. The read pass voltage is 137.5 mV lower than the read pass voltage Vread. When the selected word line is in Zone 1, (e.g., WL4-7), the unselected word lines on the source side receive a read pass voltage Vread−125. The read pass voltage is 125 mV lower than the read pass voltage Vread.

When the selected word line is in Zone 2, (e.g., WL8-11), the unselected word lines on the source side receive a read pass voltage Vread−112.5. The read pass voltage is 112.5 mV lower than the read pass voltage Vread. When the selected word line is in Zone 3, (e.g., WL12-15), the unselected word lines on the source side receive a read pass voltage Vread−100. The read pass voltage is 100 mV lower than the read pass voltage Vread. When the selected word line is in Zone 4, (e.g., WL16-19), the unselected word lines on the source side receive a read pass voltage Vread−87.5. The read pass voltage is 87.5 mV lower than the read pass voltage Vread. When the selected word line is in Zone 5, (e.g., WL20-23-7), the unselected word lines on the source side receive a read pass voltage Vread−75. The read pass voltage is 75 mV lower than the read pass voltage Vread. When the selected word line is in Zone 6, (e.g., WL24-27), the unselected word lines on the source side receive a read pass voltage Vread−62.5. The read pass voltage is 62.5 mV lower than the read pass voltage Vread. When the selected word line is in Zone 7, (e.g., WL28-31), the unselected word lines on the source side receive a read pass voltage Vread−50. The read pass voltage is 50 mV lower than the read pass voltage Vread. When the selected word line is in Zone 8, (e.g., WL32-35), the unselected word lines on the source side receive a read pass voltage Vread−37.5. The read pass voltage is 37.5 mV lower than the read pass voltage Vread. When the selected word line is in Zone 9, (e.g., WL36-39), the unselected word lines on the source side receive a read pass voltage Vread−25. The read pass voltage is 25 mV lower than the read pass voltage Vread. When the selected word line is in Zone 10, (e.g., WL40-43), the unselected word lines on the source side receive a read pass voltage Vread−12.5. The read pass voltage is 12.5 mV lower than the read pass voltage Vread. When the selected word line is in Zone 11, (e.g., WL40-47), the unselected word lines on the source side receive the standard read pass voltage Vread.

In one embodiment, the same number of zones may be used when sensing for each of the states, but the read pass voltage may still vary based on the state being sensed. In another example, additional partitions may be made for the states. For example, different read pass voltages can be used for each state.

Accordingly, an apparatus has been described that includes a group of memory cells coupled to a select gate, a program circuit configured to program a first memory cell of the group before programming a second memory cell of the group, and a sense circuit configured to sense the first memory cell by applying a first pass voltage to two or more memory cells positioned between the select gate and the first memory cell. The sense circuit is configured to sense the second memory cell by applying a second pass voltage to the two or more memory cells, the second pass voltage is different from the first pass voltage.

An apparatus has been described that includes a plurality of word lines coupled to a plurality of memory cells, and a program verification circuit. The program verification circuit is configured to apply a first pass voltage to a previously programmed word line to verify a first selected word line and is configured to apply a second pass voltage to the previously programmed word line to verify a second selected word line. The second pass voltage is higher than the first pass voltage and the second selected word line is programmed subsequent to the first selected word line.

A method has been described that includes applying a first pass voltage to two or more word lines positioned between a selected word line and a select gate during program verification if the selected word line is in a first zone of word lines, and applying a second pass voltage to two or more word lines positioned between the selected word line and the select gate during program verification if the selected word line is in a second zone of word lines. The second pass voltage is higher than the first pass voltage, the first zone is positioned between the second zone and the select gate.

An apparatus has been described that includes a source line, a plurality of word lines, means for applying to an unselected word line between the source line and a selected word line a first pass voltage based at least in part on applying a verify voltage to a first selected word line, means for applying to the unselected word line a second pass voltage based at least in part on applying the verify voltage to a second selected word line, and means for applying to the unselected word line a third pass voltage based at least in part on applying the verify voltage to a third selected word line. The first selected word line is in a first zone of word lines of the plurality. The second selected word line is in a second zone of word lines of the plurality and the second pass voltage is higher than the first pass voltage. The first zone is between the second zone and the source line and is programmed before the second zone. The third selected word line is in a third zone of word lines of the plurality, and the third pass voltage is higher than the second pass voltage. The second zone is between the third zone and the first zone and is programmed before the third zone.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a group of memory cells connected in series coupled to a select gate;
a program circuit configured to program a first memory cell of the group before programming a second memory cell of the group; and
a sense circuit configured to sense the first memory cell by applying a first pass voltage to two or more memory cells positioned between the select gate and the first memory cell, the sense circuit configured to sense the second memory cell by applying a second pass voltage to the two or more memory cells, the second pass voltage is different from the first pass voltage.

2. The apparatus of claim 1, wherein:
the second pass voltage is higher than the first pass voltage;
the sense circuit is configured to sense the first memory cell as part of a program verification operation by applying a verify voltage to the first memory cell and applying the first pass voltage to the two or more memory cells; and
the sense circuit is configured to sense the second memory cell as part of a program verification operation by applying the verify voltage to the second memory cell and applying the second pass voltage to the two or more memory cells.

3. The apparatus of claim 2, wherein:
the sense circuit verifies that the first memory cell is programmed by applying a third pass voltage to two memory cells adjacent to the first memory cell and applying the first pass voltage to the two or more memory cells;
the sense circuit verifies that the second memory cell is programmed by applying the third pass voltage to two memory cells adjacent to the second memory cell and applying the second pass voltage to the two or more memory cells; and
the third pass voltage is higher than the second pass voltage.

4. The apparatus of claim 3, wherein:
the select gate is a source select gate coupled between the group of memory cells and a source line;
the first memory cell is positioned between the second memory cell and the source select gate; and
the two or more memory cells receiving the first pass voltage are two or more memory cells that are subjected to programming after erase and prior to programming the first memory cell;
the sense circuit is configured to apply the first pass voltage to each other memory cell of the group that is positioned between the first memory cell and the source select gate and that has been subjected to programming after erase and prior to programming the first memory cell.

5. The apparatus of claim 4, wherein:
the sense circuit applies a third pass voltage to two or more unprogrammed memory cells positioned between the first memory cell and a drain select gate while applying the first pass voltage to the two or more previously programmed memory cells, the third pass voltage is less than the first pass voltage; and
the verification circuit applies the third pass voltage to the two or more unprogrammed memory cells while applying the second pass voltage to the two or more previously programmed memory cells.

6. The apparatus of claim 1, wherein:
the first pass voltage is higher than the second pass voltage;
the sense circuit is configured to sense the first memory cell as part of a read operation by applying a read reference voltage to the first memory cell and applying the first pass voltage to the two or more memory cells; and
the sense circuit is configured to sense the second memory cell as part of a read operation by applying the read reference voltage to the second memory cell and applying the second pass voltage to the two or more memory cells.

7. The apparatus of claim 1, further comprising:
a plurality of word lines each coupled to a corresponding one of the memory cells, whereby the sense circuit applies the first pass voltage and the second pass voltage to the two or more memory cells.

8. The apparatus of claim 7, wherein the group of memory cells are part of a first NAND string and the apparatus further includes one or more additional NAND strings coupled to the plurality of word lines.

9. The apparatus of claim 1, wherein the sense circuit includes a sense amp, the apparatus further comprising:
a bit line whereby the group of memory cells is connected to the sense amp.

10. The apparatus of claim 1, wherein the group of memory cells is part of a non-volatile memory array, and the non-volatile memory array is arranged in a three dimensional structure.

* * * * *